(12) United States Patent
Hodes

(10) Patent No.: US 10,766,775 B1
(45) Date of Patent: Sep. 8, 2020

(54) METHOD OF PRODUCING DIAMOND USING SHOCKWAVES

(71) Applicant: Daniel Hodes, Owings Mills, MD (US)

(72) Inventor: Daniel Hodes, Owings Mills, MD (US)

( * ) Notice: Subject to any disclaimer, the term of this patent is extended or adjusted under 35 U.S.C. 154(b) by 0 days.

(21) Appl. No.: 16/602,068

(22) Filed: Aug. 5, 2019

(51) Int. Cl.
| | |
|---|---|
| *C01B 32/184* | (2017.01) |
| *C01B 32/26* | (2017.01) |
| *C01B 32/28* | (2017.01) |
| *C23C 16/27* | (2006.01) |

(52) U.S. Cl.
CPC ............ *C01B 32/26* (2017.08); *C01B 32/184* (2017.08); *C01B 32/28* (2017.08); *C23C 16/27* (2013.01)

(58) Field of Classification Search
CPC ....... C01B 32/26; C01B 32/184; C01B 32/28; C23C 16/27
See application file for complete search history.

(56) References Cited

U.S. PATENT DOCUMENTS

| | | | |
|---|---|---|---|
| 2,297,305 | A | 11/1942 | Kerst |
| 3,480,811 | A | 11/1969 | Grosbard |
| 4,710,722 | A | 12/1987 | Jahnke |
| 7,656,258 | B1 | 2/2010 | Antaya et al. |
| 8,778,295 | B2 * | 7/2014 | Hodes ............... C01B 32/25 |
| | | | 423/446 |

OTHER PUBLICATIONS

Goulay, et al. "Cyclic Versus Linear Isomers Produced by Reaction of the Methylidyne Radical (CH) with Small Unsaturated Hydrocarbons", J. Am. Chem. Soc. 2009, 131, 993-1005.
Okamura, et al. "Steering Magnet Design for a limited space", Brookhaven National Laboratory, BNL-81842-2009-CP (2009).
Anderson, et al. "Fast-Flow Studies of CH Radical Kinetics at 290 K", J. Phys. Chem. 1987, 91, 6272-6277.
Engeln, et. al. "Detection of CH in an expanding argon/acetylene plasma using cavity ring down absorption spectroscopy" Chem. Phys. Letters 310 (1999) 405-410.
Becker, et al. "Lifetime Measurements in Electronically Excited CH (A (exp) 2 delta) Radicals" Chem. Phys. Letters vol. 71 No. 2 Apr. 15, 1980.
NRL Report AD-A236 202 (Unclassified) May 16, 1991.
Khalil, et al. "Magnetic-Based Motion Control of Paramagnetic Microparticles With Disturbance Compensation", IEEE Transactions on Magnetics, vol. 50, No. 10, Oct. 2014.

* cited by examiner

*Primary Examiner* — Michael P Wieczorek
(74) *Attorney, Agent, or Firm* — Juneau & Mitchell IP Law Firm; William Beaumont

(57) ABSTRACT

A method of producing a diamond monolayer, which entails impacting a target containing a supported or immobilized layer of dihydrobenzvalene with a fluence of accelerated CH radicals, producing upon impact a shock wave not exceeding the strain energy of the dihydrobenzvalene, to form, thereby, the diamond monolayer; and then impacting a supported and heated diamond monolayer with a fluence of accelerated CH radicals sufficient to produce an instantaneous pressure at a surface of the diamond monolayer to favor diamond formation over graphite formation, to form diamond mass; said heated diamond monolayer being heated to a temperature of at least about 500° C.

13 Claims, 10 Drawing Sheets

METHOD OF PRODUCING DIAMOND USING SHOCKWAVES

BACKGROUND OF THE INVENTION

Diamond is the allotrope of carbon which, when pure, provides it the following properties:

Hardness: 10 on the mohs scale (10=hardest); electrical resistance: $10^{18}$ Ω·m; thermal conductivity: ~2500 W·m/m$^2$ (Cu=385 W·m/m$^2$); refractive index: 2.417; dielectric constant/strength: 5.6, $10^7$V/cm; band gap: 5.45 eV; mobility: 1,600 cm$^2$/Ns; oxidation temperatures: air:=~1000° C., O2=~600° C.; graphite transformation temperature (vacuum, inert atmosphere): ~1,500° C.; widest known transmission spectrum: 220 nm to >50 µm—x-ray, infrared, terahertz and microwave; highly chemical inert; lowest coefficient of thermal expansion: 1.1-1.3 (Invar=1.4); solid surface friction (surface passivated): <0.1.

In addition to its highly desirable physical properties, diamond is a beautifully lustrous transparent crystal making it the "King" of gemstones.

A few of the numerous industrial applications which could exploit the highly desirable physical properties of very pure diamond include electronics and semi, conductors, optics and directed energy windows, mining and petrology, and bearings. Diamond is also used in detectors in particle physics experiments such as those in C.E.R.N. where fusion products cause doped diamond detectors to fluoresce. However, artificially produced diamond has not attained the level of purity in quantities which are economical and sufficient for extensive industrial use.

When pure, diamond is the ideal material for semiconductor heat spreaders. Diamond, itself, may find use as a semi-conductor device material with its wide band gap. Boron doped diamond (blue diamond) is a p-type semiconductor. Quantum computing devices using nitrogen doped diamond are becoming commercially available. Diamond semi-conductors may have switching speeds of 80 Ghz or higher.

Diamond powder is pressed into and bonded with end effectors of mining and rock drilling bits at pressures around 1 million psi. Such bits typically comprise tungsten carbide containing a small percentage of cobalt powder, under high pressure, cobalt grows into the diamond (brachiation) to bond and adhere the diamond to the tungsten carbide. However, non-diamond carbon impurities in the diamond interfere with brachiation causing diamond to wear off before it wears out in use. Rock bits typically fail after 250 feet.

Turbine shaft bearings comprise metal shaft and race surfaces coated with tungsten carbide upon which diamond films are deposited. Between the shaft and race, surface passivated diamond powder is deployed to provide a low-friction, high temperature stable solid lubricant. Adhesion of the diamond layers to the tungsten carbide layers fails due to non-diamond impurities within the diamond layer leading to bearing failure.

The diamond products used in these limited examples of the industrial use of diamond are most often produced by either of the two most common diamond fabrication methods: HPHT (high pressure/high temperature) and CVD (chemical vapor deposition).

HPHT emulates the natural process of diamond formation deep within the earth's crust wherein elemental carbon is subjected to high temperatures, ~2000° C., and high pressures, ~1.5 million psi. Under these conditions, molten carbon forms diamond by assembly of carbon atoms about small diamond particles or diamond seeds. Product cycles range from about 3 weeks to 2 months. The apparatus required for HPHT diamond fabrication such as belt or cubic press type anvils is expensive and cumbersome. Small laboratory apparatus can cost several hundreds of thousand dollars.

CVD diamond fabrication processes grow diamond by energetic decomposition of a carbon source gas such as methane in a sealed chamber having a diamond forming surface heated to ~800° C. bearing diamond particulates which function as the seed about which carbon atoms assemble to form diamond. Product cycles range from 2 weeks to 2 months. CVD processes produce more diamond per cycle than do HPHT processes, but there are higher labor, power, and support costs for CVD processes than for HPHT processes.

A need exists for methods of diamond fabrication which can provide high purity diamond products reliably, economically, and readily. Conventional diamond fabrication methods include HPHT (anvil or high pressure, high temperature) and CVD chemical vapor deposition. Thus far, these processes have not produced diamond products of requisite purity, but these processes do produce substantial quantities of diamond products which are used industrially.

SUMMARY OF THE INVENTION

It is an object of the present invention to identify and correct the flaws of conventional CVD diamond fabrication processes.

It is an object of the present invention to provide a method for generating CH molecules which are radical species having one unpaired electron, methylidyne, or radical species having three unpaired electrons, methanetriyl, for use in chemical reactions and/or chemical processes.

It is an object of the present invention to form said methylidyne or methanetriyl molecules by radiolysis of acetylene.

It is an object of the present invention to provide means to impart kinetic energy to said methylidyne or methanetriyl radicals which are paramagnetic species by virtue of their unpaired electron(s), and thus, magnetically susceptible, by magnetic acceleration.

It is also an object of the present invention to provide a method of producing diamond by impacting thermally-stable tetrahedranoidal molecules with kinetically energized CH radicals.

It is more specifically an object of the claimed invention to produce diamond, in a first step, by accelerating said CH radicals prior to impacting the thermally-stable tetrahedranoidal compound which is affixed to a deposition surface upon which the thermally-stable tetrahedranoidal compound may be supported or immobilized.

It is an object of the present invention to provide said surface supported or affixed thermally-stable tetrahedranoidal compound as a monolayer.

It is an object of the present invention to produce said diamond in a first step, which is obtained by impacting said supported or immobilized thermally-stable tetrahedranoidal compound with kinetically energized CH radicals, as a diamond monolayer.

It is an object of the present invention to produce a monolayer of graphite by subjecting said first step diamond mono layer to conditions known to effect the transformation of diamond to graphite.

It is an object of the present invention to produce nano-diamond particles by impacting said first step diamond mono-layer with a die having a nano-patterned impact surface to fracture the diamond monolayer into nano-diamond particles.

These and other objects are provided by a method for producing diamond in a first step which entails: a) generating methylidyne or methanetriyl radicals by radiolysis of acetylene, b) accelerating the methylidyne or methanetriyl radicals generated in an accelerator capable of accelerating the radicals to impact an immobilized or supported thermally-stable tetrahedranoidal compound target with insertion of the radicals into the cage position of the immobilized thermally-stable tetrahedranoidal compound, thereby producing diamond.

It is an object of the present invention to form diamond in a second step, by impacting said monolayer of diamond, formed by impacting said thermally stable tetrahedranoidal compound with kinetically energized CH radicals, by directing magnetically accelerated CH radicals onto said diamond monolayer to produce a shock wave of sufficient magnitude to provide an instantaneous effective pressure adequate to favor formation of diamond and not graphite, and continuing to provide the accelerated CH radicals to the supported diamond layer to produce a diamond mass.

DETAILED DESCRIPTION OF THE PREFERRED EMBODIMENTS

Term Definitions

Figure 1:
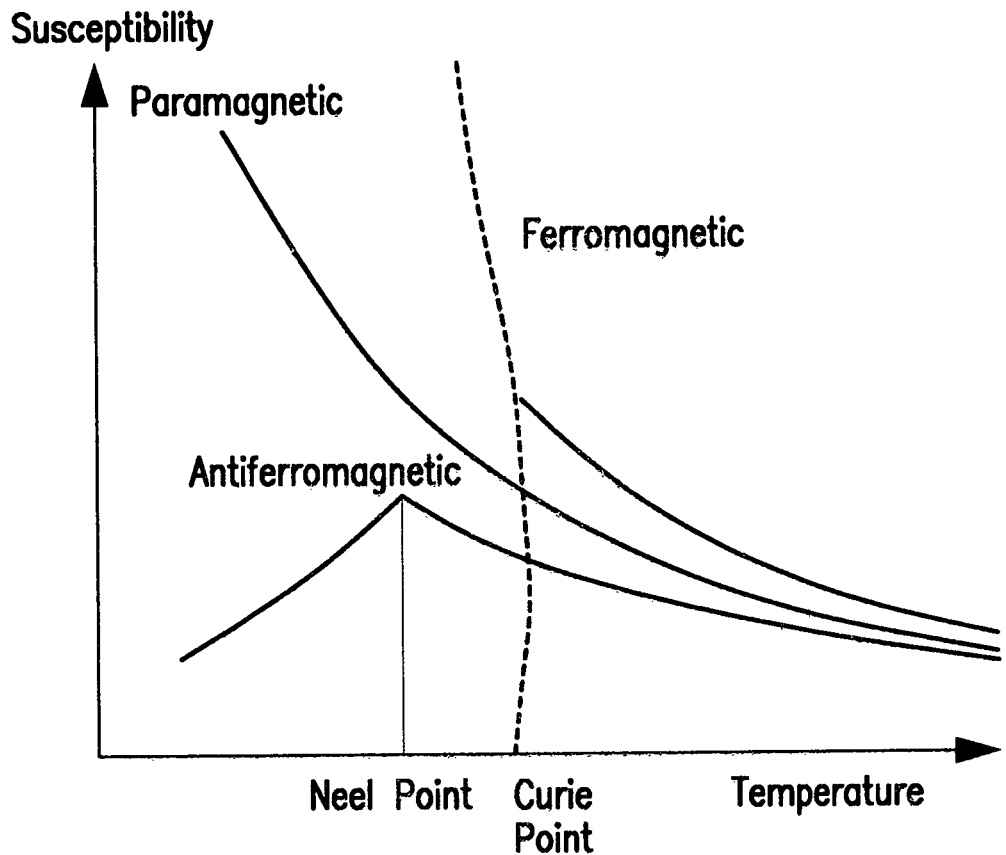
FIG. 1 illustrates how paramagnetic susceptibility varies inversely with temperature.

The following terms are used throughout the present specification as defined herein.
Bond: (covalent chemical bond) the association of two atoms by their shared valence electrons
Bond Length: the distance between atomic centers of two atoms bound together in a covalent bond.
Covalent Radius: the size of an atom that forms part of one covalent bond; hydrogen-31 picometers; carbon-76 picometers
Van der Waals Radius: spherical representation of the distance of closest approach by another atom not chemically bonded to it; hydrogen=120 picometers (vapor phase), 109-110 picometers (solid state measurement); carbon=170 picometers.
Graphene: an allotrope of carbon consisting of a single layer of carbon atoms arranged in the graphite hexagonal lattice attributed to graphite.
Methine carbon: means a carbon atom bonded to which is bonded a single hydrogen atom. A methine carbon atom may be any of sp, $sp^2$ or $sp^3$ hybridized.
Methylidyne carbon: when radicality is considered, this term means either a CH radical with one unpaired electron, which is named a methylidyne radical; or an excited state CH radical with three unpaired electrons, which is named a methanetriyl radical. The CH radical with one unshared electron is also called carbyne, which is the preferred IUPAC name.
Radiolysis of acetylene: means the application of energy to acetylene molecules sufficient to cause scission of the acetylene molecules into either methylidyne or methanetriyl radicals, both of which are paramagnetic. Any form of radiant energy may be used from the ultraviolet range to the microwave range. Most commonly, a microwave generator is used to effect radiolysis of acetylene. The microwave radiolysis may be affected at from 1 to 15 Kw at 1 to 10 GHz, and, in particular from 1-6 KW at 2.45 GHz.
Paramagnetic radical or radicals: means radicals having at least one unshared electron and, thus, susceptible to paramagnetic fields. As used herein, either term refers to methylidyne or methanetriyl radicals.
Magnetic accelerator: means a device or apparatus capable of generating a magnetic field through which paramagnetic radicals may be accelerated under the influence of electromagnets to high velocities. See, for example, U.S. Pat. Nos. 4,710,772 and 8,232,747, both of which are incorporated by reference herein in the entirety.
Shockwave: as used herein refers to the transfer of kinetic energy obtained upon impact of an accelerated stream of radicals upon deposition substrate to the substrate and materials deposited thereon. The shock wave is produced as a consequence of Newton's second law of motion, i.e., F=ma, or Force=mass×acceleration. That is, the accelerated radicals will impact the deposition substrate or target with more force than is attributable to their mass alone.
Thermally-stable tetrahedranoidal compound: as used herein means a hydrocarbon compound that has an approximate tetrahedral-shape. Typically, such compounds have a single apex methine carbon. One example of such a molecule or compound is dihydrobenzvalene. Moreover, such molecules or compounds must be thermally stable up to about 300° C. Such a compound is placed on a deposition substrate or target for receiving accelerated CH radicals and the resultant impact produced shock wave. The compound must be supported or otherwise immobilized.
About: as used herein, about means up to plus or minus 10% of the stated value. Thus, for example, the phrase "about 100" means a range of from 90-110.
Inert gas: as used herein means-a noble gas with the exclusion of radon. Generally, helium argon, neon, krypton or xenon may be used, but helium is mandated by the operating temperature of the accelerator, 77° K, provided by liquid nitrogen refrigerant.

Reactor system: as used herein means the entire apparatus used in the present invention to produce or fabricate diamond which entails:
1) reaction chamber in which CH radicals are generated from dissociation of acetylene, upstream of and operatively connected to the input of
2) an accelerator track into which the CH radicals pass from the upstream reaction chamber and are accelerated by application of magnetic fields thereto, and
3) a diamond forming reaction chamber downstream of and operatively connected to the exit of the magnetic accelerator track which provides the accelerated CH radicals to a diamond forming deposition substrate or target upon which may be a layer of a thermally-stable tetrahedranoidal compound, a diamond layer or a diamond mass.

Further, the entire apparatus contains four (4) helices, which are:
1) the accelerator track tubing containing inter-connected accelerator segments and combined carrier gas secondary RF segments,
2) the carrier gas manifold,
3) accelerator power-data lines, and
4) secondary power-data lines.

Figure 11:
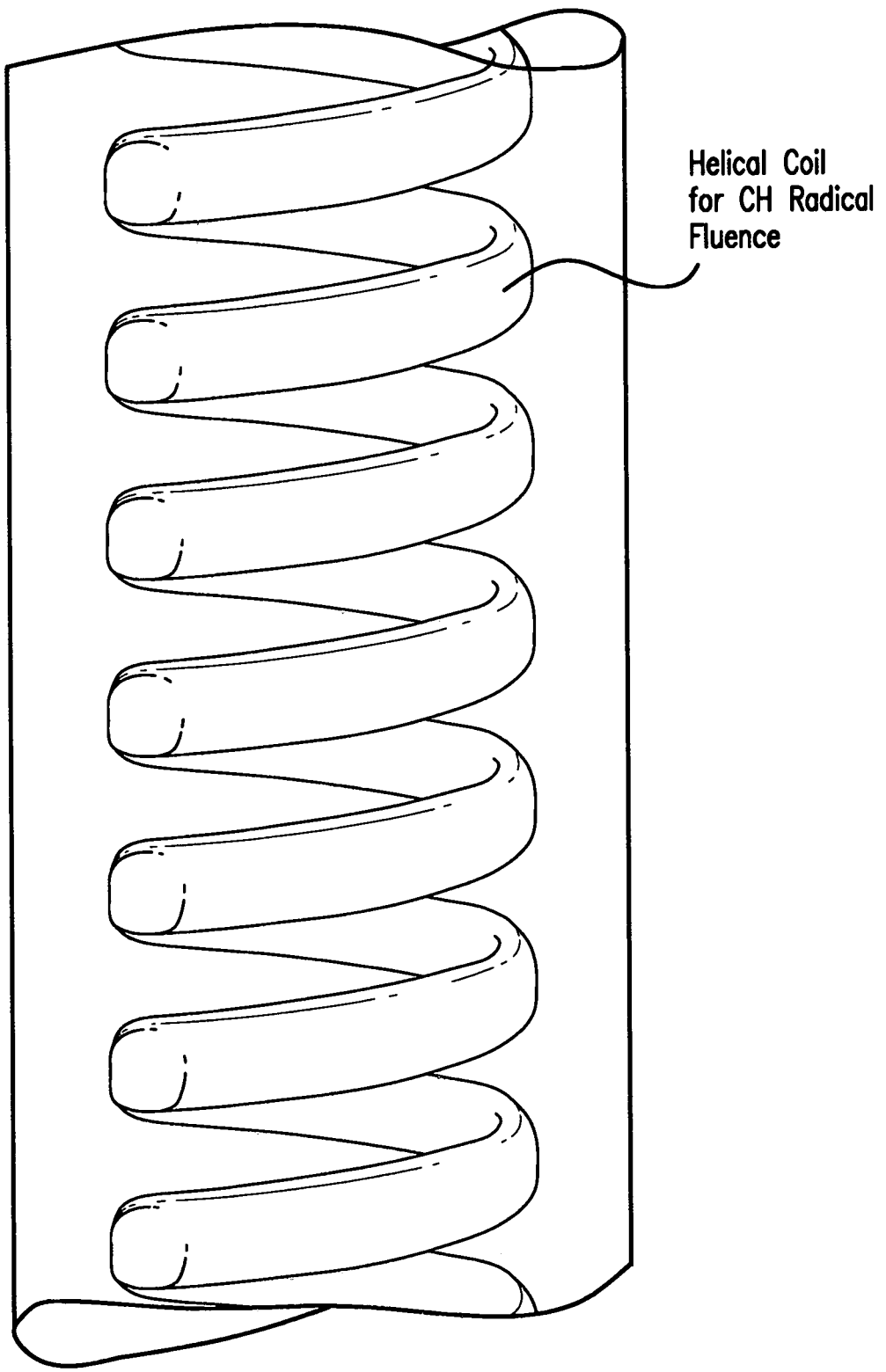
FIG. 11 illustrates a section of helical tubing within an accelerator (toroidal) for containing a CH radical fluence on an accelerated approach to a target. The helical tubing is cooled by a liquid nitrogen refrigerant jacket. Inter-fitting segments not shown. Helical tubing is used only in toroidal accelerators, and not in linear accelerators. The latter use straight tubing.

Each helix as defined herein is a contiguous structure.
Helical tubing: Used in each of the four (4) tracks noted above, but not in the input and output sections which enter/exit linearly but curve into/out from the helical structure. The tubing should not contact the walls of the Dewar (enclosure), but can have as little as 1 cm clearance. All that is necessary is that the helix be immersed within (surrounded by) the refrigerant-liquid nitrogen. Further, in accordance with the present invention, the refrigerant supply has a means to sense coolant level and vapor emission through the exit valve to maintain adequate refrigerant level during operation. The accelerator is somewhat exothermic even though the coefficient of electrical resistance is greatly reduced at low temperatures. Note that while helical tubing must be used in the toroidal accelerator, straight tubing, rather than helical tubing, is used in the linear accelerator.
Carbyne: as used herein means CH radicals, either methylidyne or methantriyl radicals.
Elevated temperature of target or deposition substrate: means about 400-800° C. and more particularly from about 500-600 degrees C. Higher temperatures can be used but are generally not necessary.
Accelerator segment: means one segment of a complete accelerator. In particular, this refers to a single electromagnet which may be energized by a digitally addressable switch, for example.
Accelerator track: a contiguous helical structure containing two types of inter-fitting segments. The helical shape of the accelerator track is illustrated in FIG. 11, which shows a section of helical tubing within a toroidal accelerator of the present invention for containing CH radical fluence for accelerated approach to a target.
Low Power: as used herein means about 10-25 amperes.
Medium Power: as used herein means about 100 amperes.
Higher Power: as used herein means about 1,000 amperes; limited to pulse mode.
First step: means a step, the purpose of which is to provide a homogeneous, contiguous, and ultra-pure diamond layer which may be:
1) a stand-alone or final diamond product;
2) a precursor to nano-diamond particles by patterned fracture thereof;
3 a precursor for the transformation of diamond to mono-layer graphite, graphene;
4) a pure and contiguous diamond seed or template for formation of diamond by carbon atom assembly in a second step diamond forming process.

Figure 7:
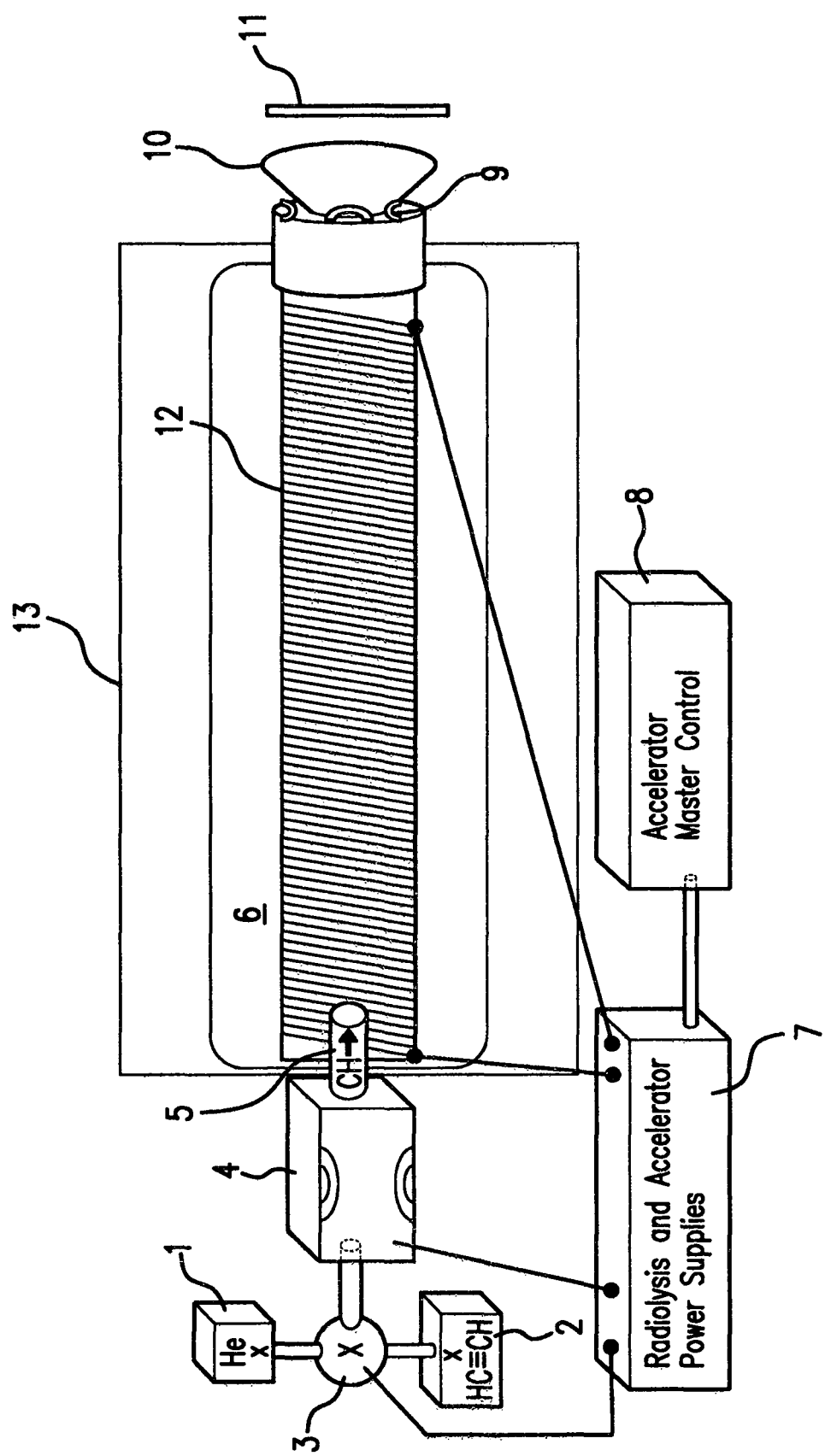
FIG. 7 illustrates a full component linear accelerator apparatus.

An apparatus for conducting the first step is illustrated in FIG. 7.
Second step: means a second step CVD diamond fabrication process which uses CH radicals as the diamond forming carbon source which radicals are subjected to high levels of magnetic acceleration to exploit the large magnitude shock wave produced by impact of CH radicals on the supported and heated diamond mono-layer to provide an effective instantaneous surface pressure which favors diamond formation over graphite.

Figure 6:
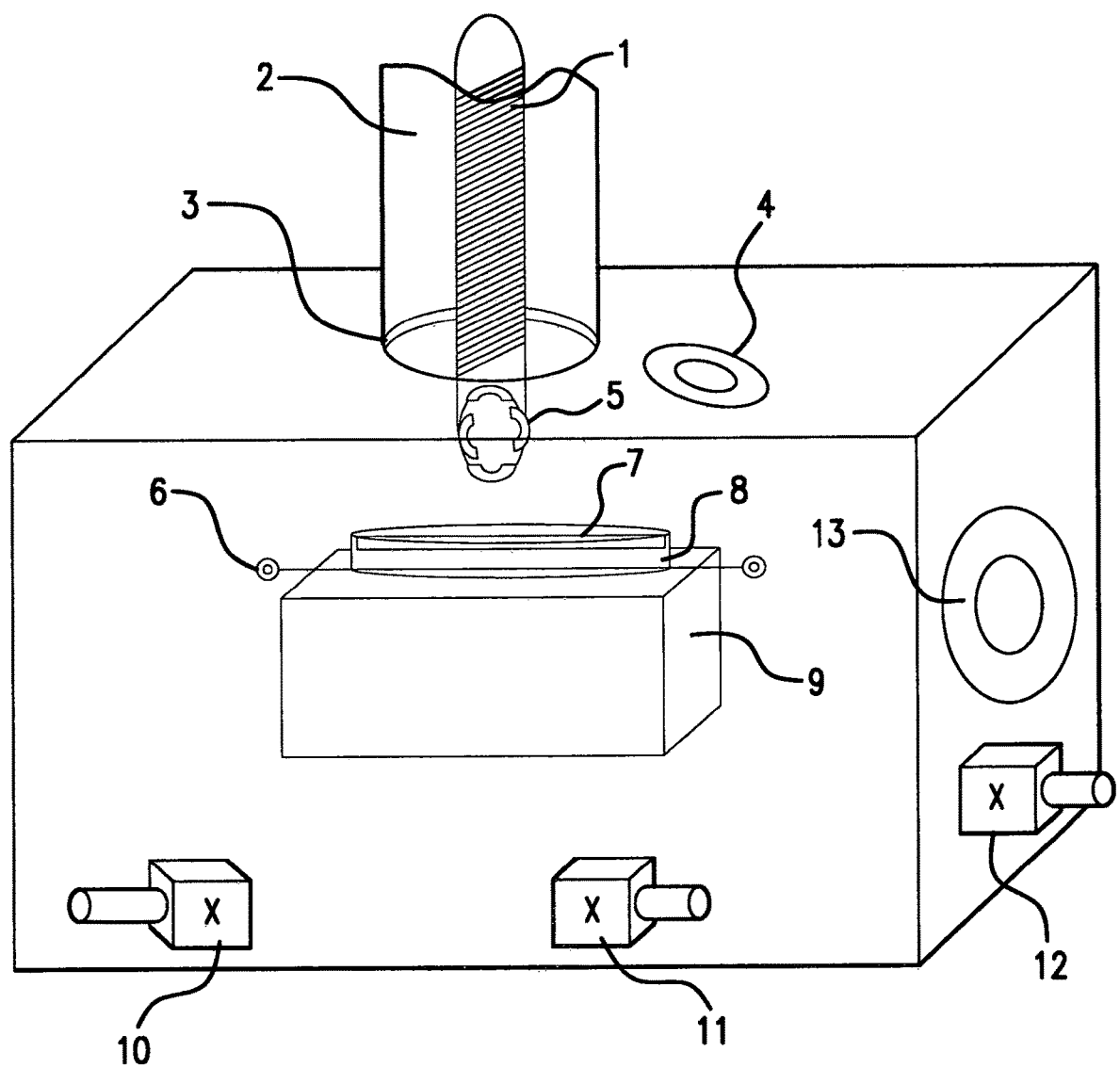
FIG. 6 illustrates a diamond fabrication reactor used in the step 2 high acceleration CH radical fluence reaction.

An apparatus for conducting the second step is illustrated in FIG. 6.
Magnetic Susceptibility: is a measure of the extent to which a substance becomes magnetized when it is placed in an external magnetic field, and is defined as: Magnetic susceptibility=$J/B_o$, where J is the magnitude of the internal polarization, and $B_O$ is the strength of the external field. Paramagnetic substances, such as molecular oxygen, simple salts and chelates of metals, such as Gd, Fe, Mn and Cu, and organic free radicals have a magnetic susceptibility value of +1. The present invention takes advantage of the paramagnetic susceptibility of organic free radicals, in particular, which when magnetized align themselves in the direction of the external magnetic field. Use of switching drive sections in conjunction with a plurality of magnetic core sections leads to rapid acceleration of the disclosed CH radicals in the direction of the magnetic field.
Invar: is an alloy of iron and nickel having a negligible coefficient of thermal expansion and used, for example, in the making of clocks and scientific instruments.
Vacuum: As used herein the following known definitions apply:
   low vacuum: down to $1 \times 10^{-3}$ torr
   medium (or intermediate) vacuum: $<1 \times 10^{-3}$ to $10^{-5}$ torr
   high vacuum (HV): $<1 \times 10^{-5}$ to $10^{-8}$ torr
   ultrahigh vacuum (UHV): $7.5 \times 10^{-10}$ to $7.5 \times 10^{-11}$ torr
   extreme ultrahigh vacuum: $<7.5 \times 10^{-13}$ torr
Different types of vacuum pumps for achieving various degrees of vacuum as defined above are well-known and commercially available.
Ultra-low temperature polymers: In the present invention, all tubings are preferably made on polytetrafluoroethylene (PTFE or telflon). However, other polymers, such as PCTFE (polychlorotrifluoroethylene) and FER (polyfluoroethylene-propylene) may also be used. By "ultra-low temperature polymers as used herein is meant polymers that retain their integrity at 77° K, the temperature of liquid nitrogen as used herein as a refrigerant. Generally, linear tubing is used in linear accelerators, and helical tubing is used in toroidal accelerators.
Tubing Width and Shaping: Linear and helical ultra-low temperature polymer tubing made of PTFE, PCTFE and FER may be commercially obtained from Zeus, Inc,. headquarted in Orangeburg, S.C., and from Axenics of Middleton Mass. Generally, both straight and helical tubing of these polymers have a wall thickness of from about ⅛ in. to 1 inch in diameter. The tubing inner diameter may be from about ½ in. to 1 inch in diameter.
Refrigerant: In the present invention, liquid nitrogen is used as a coolant at a temperature of about 77° K. A refrigerant jacket for the entire contents within the enclosure are cooled by a single refrigerant jacket adjacent to the inside of the enclosure. Thus, there is no need to cool individual tracks within the enclosure with their own refrigerant jackets. At normal atmospheric pressure, nitrogen is a liquid between 77.2 K. Below 63K, it freezes into solid nitrogen. Because liquid nitrogen in a typical setting is boiling, its usual temperature is 77K.

The Dewar (the enclosure): The apparatus of the present invention is a Dewar as the enclosure is an outer wall with an inner wall therein. Between the inner and outer wall is either a vacuum or a good insulator, such as polyurethane foam. Generally, the inner and outer walls of the Dewar are made of either aluminum or stainless steel. The Dewar is essentially a thermos. However, Nalgene dewars having a dual (inner and outer) wall evacuated nalgene cylinder are available commercially. These are nearly as effective as silvered-glass dewars (in a metal surround) and are safer. Even when cold from liquid nitrogen nalgene dewars are not sufficiently brittle to break if dropped from waist height. A nalgene dewar may be used to construct the enclosure disclosed herein, i.e., having dual nalgene walls.

The Dewar necessarily has a nitrogen escape/safety valve to vent excessive nitrogen pressure. There are several types of escape/safety valves that many be used with therewith. For example, Schroeder valves, burst-disk valves, or CPU controlled blow-off valves may be used.

Escape/safety valves: Schroeder valves rely upon a spring bias to remain closed until a back pressure exceeds the bias causing the valve to open and remain open until the overpressure ceases. The burst-disk valve integrity is based on the strength of the material from which the disk is made, and ruptures based upon the pressure required to burst the disk. Check valves and gate valves are also well known as are CPU controlled blow-off valves. Any of these may be used in with the disclosed apparatus to avoid build-up of excess nitrogen pressure. All are well known to those of ordinary skill in the ar.

Acetylene Radiolysis Reactor

The diamond fabrication method of the present invention uses accelerated CH radicals as the source of carbon. Methods of generating the CH radical species are known. For example, the hydrolysis reaction of $CHBr_3$ is reported to produce CH and HBr efficiently, See M. R. Berman, et al, Chem. Phys. 73 (1982) 27-33. This method is not suitable for the method of the present invention due to product purity considerations. Means to trap out water vapor and bromine/bromide species would overly complicate an apparatus and its operation. The production of methylidyne radicals from acetylene is known (See K. H. Becker, et al., *Chem. Phys. Lett.*, vol. 71, no. 2 (15 Apr. 1980) and R. Engeln, et al., *Chem. Phys. Lett.*, 310 (1999) 405-410.)

The method of the present invention produces CH radicals by microwave radiolysis of acetylene in an inert carrier gas such as argon or helium at ~2.45 Ghz and at 6 Kw. Magnetron amplifiers capable of such frequency and power are available commercially. The radiolysis reactor is a wave guide comprising a chemically inert material such as silicon carbide used extensively in high power microwave environments and is fitted with microwave emitters. Radiolysis of acetylene occurs within this wave guide reactor. Generally, Helium is preferred as the inert carrier gas.

The enthalpy of formation for acetylene is reported to be 226.73 Kj/mol (See N.I.S.T. Chemistry Web Book, SRD 69). The power and frequency levels used in the present invention are more than adequate to fission acetylene into two CH radicals operating at a flow rate of no more than 1 mmol/second of acetylene at 1% v/v dilution in an inert carrier gas such as helium. Output of the radiolyzed stream of CH radicals in inert carrier gas into the magnetic accelerator input is by the shortest possible path, and the radiolysis product stream must be cooled at the magnetic accelerator input. The accelerator must use helium as the carrier gas within the CH acceleration flow path due to its low temperature operation, 77° K. Argon melts at 83.8° K and cannot be used as the carrier gas without complex gas separation equipment at the input.

The radiolysis reactor must be operated under computer control for power, acetylene flow, carrier gas flow, acetylene-carrier gas blending, output coolant, and throttling of radiolysis product flow into the magnetic accelerator. This arrangement should include flow, power, and temperature sensors for incorporation into a closed loop type overall control system.

Figure 4:
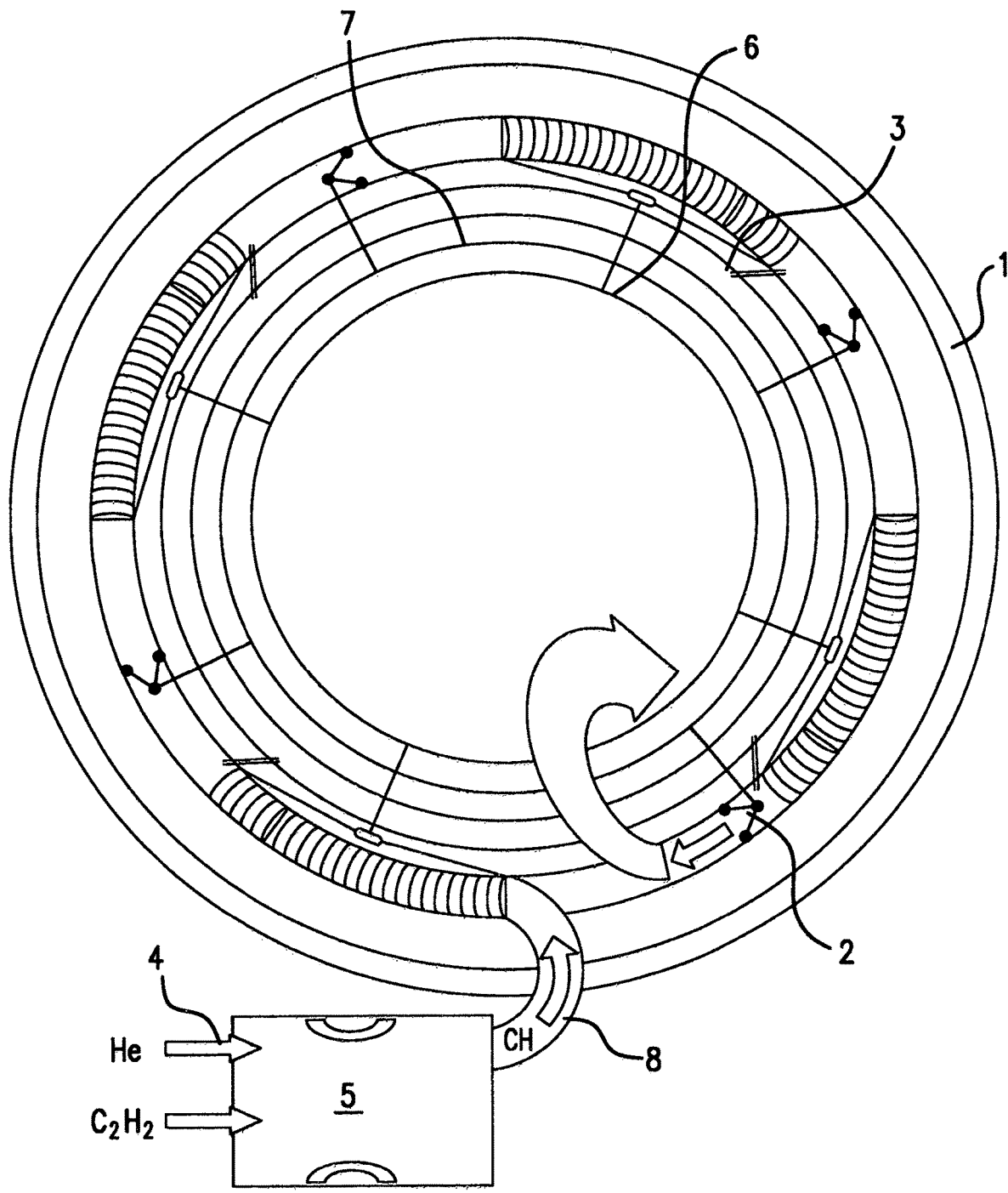
FIG. 4 illustrates a top view of an input accelerator segment.

The radiolysis reactor is depicted in FIGS. 4 and 7 in relationship to a top view of a toroidal input accelerator segment, and a linear accelerator, respectively.

Magnetic Accelerator

The magnetic accelerator of the present invention exploits the phenomenon of paramagnetism. Paramagnetism is the susceptibility to a magnetic field by a species having unpaired electrons. As such, they are susceptible to magnetic fields but not electric fields which can influence ionic or charge bearing species. The paramagnetic species of the present invention, the methylidyne or methanetriyl (CH) radicals, are charge neutral and are not influenced by electric fields as are ionic species.

Investigations into the magnetic susceptibility of low molecular weight hydrocarbon radicals are reported in "Magnetic Properties of Free Radicals", Volume 17, H. Fisher et al., and effective magnetic moments of some paramagnetic species are found in "Magnetic Properties of Free Radicals, Landolt-Bernstein, New Series", Group II, Volume 1, Berlin: Springer 1965 and Vols. 9aa-9d2, 1965. An important finding is that the g-factor (isotropic factor) of such radical species is very close to that of the free electron which is extremely susceptible to magnetic fields, $g_e$=2.0023193134. The paramagnetic g-factor is an isotropic measurement, or, more simply, a measure or orderliness of a paramagnetic species within an applied magnetic field. The more highly ordered a magnetically susceptible (paramagnetic) species is within a magnetic field, the greater is the influence upon that species by the magnetic field. Application of a magnetic field to a mass of paramagnetic species results in first order Zeeman splitting or an energy difference, $\Delta E$, between aligned and unaligned magnetic dipoles which is a proportional to magnetic field strength. The difference between aligned and unaligned is given by the Boltzman expression $e^{-\Delta E/kt}$. Where $\Delta E$ is much smaller than kT, the exponential can be expanded as $1-\Delta E/kT$. This indicates that paramagnetic susceptibility is inversely proportional to temperature. See Figgis, B. N.; Lewis, J. (1960). "*The Magnetochemistry of Complex Compounds*". See FIG. 1.

These properties are exploited by the magnetic accelerator of the present invention in its design and operation. Magnetic accelerators are known such as those described in U.S. Pat. Nos. 4,710,722 and 8,232,747, both incorporated herein by reference in the entirety. While features of both references may be incorporated into the magnetic accelerator design of this invention such as curved or linear particle tracks or their combination, plural solid state switched drive sections, plural magnetic core sections, and a switch control module, the magnetic accelerator design used in this invention differs from these accelerators. The magnetic accelerator of this invention does not accelerate species bearing electrical charge. Rather, it is used to accelerate paramagnetic species which bear no electrical charge and are not influenced by or susceptible to electrostatic fields. Specifically, the species subjected to magnetic acceleration by the apparatus of the present invention are CH radicals which are charge neutral but are magnetically susceptible because they are paramagnetic having one or three unpaired electrons.

The magnetic accelerator of the present invention is comprised of plural, sequentially deployed accelerator segments which are hollow core inductors sequentially energized and de-energized to provide sequential magnetic fields which impart kinetic energy to the magnetically susceptible paramagnetic CH species (radicals) and transit said paramagnetic species through the accelerator. Each segment is an induction coil having enameled or otherwise insulated silver or oxygen free hydrogenated copper wire wound about a hollow core comprising a chemically inert and electrically insulating material. The hollow core provides the flow path for the stream of accelerated paramagnetic CH molecules or radicals. This hollow core flow path is helical in configuration and cooled by a liquid nitrogen refrigerant jacket. See FIG. 11.

An example of a magnetic accelerator is a solenoid valve such as a fuel injector for an internal combustion engine which throttles a fuel-air mixture within the intake manifold to the input port of a cylinder. The fuel injector comprises a hollow core inductor, a ferromagnetic valve stem, and a spring. The spring biases the valve stem to close the cylinder input port. Upon application of an electric current to the inductor, the induced magnetic field provides sufficient force to the magnetically susceptible valve stem to move it against inertia and the spring bias to open the cylinder input port to receive the fuel-air mixture. Upon cessation of electric current to the coil, the magnetic field collapses, and the spring force restores the valve stem to the closed position. The magnetically susceptible material of the solenoid differs from that within the accelerator segment of the present invention, but the principal of using electromagnetic force to move a mass is the same.

The accelerator of the present invention comprises a series of tubular accelerator segments about which insulated (enameled) silver or oxygen free hydrogenated copper wire is wound. Thus, the accelerator segment is a hollow core coil, an inductor, and it functions as the confining flow path for the magnetically susceptible material contained therein. The material comprising the accelerator segments must be chemically inert, electrically insulating, and sufficiently flexible to form a curved shape for construction of a torus accelerator. The preferred material is teflon which is available commercially in many shapes and diameters having a vast array of fittings and connectors also available commercially. The choice of which of the many types of teflons to be used in the accelerator can best be determined from information about its chemical and physical properties in corrosive environments such as low earth orbit (see, for example, NASA Technical Memorandum 113153 "Investigation of Teflon FEP Embrittlement on Spacecraft in Low Earth Orbit" June, 1997).

The accelerator may have a linear or torus structure or a combination of both linear and torus structures comprising the plurality of accelerator segments with the torus structure providing the longest total accelerator path length for the smallest size apparatus. Linear structure is best suited to applications requiring only small magnitude accelerating force. The accelerator of the present invention requires a second type of segment which provides two functions but has no components for inducing electromagnetic force upon the mass contained within it. See FIG. 7 for a linear accelerator depiction and FIGS. 5 and 6 for depiction of a toroidal accelerator.

The first function is to provide radio frequency energy to the paramagnetic species to stimulate their electronic state from 1 to 3 unpaired electrons, improving magnetic susceptibility. Radio frequency emitting elements are best deployed upon its periphery but may be deployed within the segment if they are inert to the harsh chemical environment within the segment. Drawing on practices of EPR spectroscopy, which characterizes properties and structures of paramagnetic materials by stimulating the electronic state of paramagnetic molecules or atoms with radio frequency energy and observing energy emitted from the paramagnetic species upon relaxation from the excited state in a magnetic field, a frequency of ~9 Ghz at power levels of around 200 watts are sufficient. One of normal skill in the art may adjust both frequency and power levels as desired, however.

The second function of this segment is to provide secondary carrier gas input. This segment has no electromagnetic elements but comprises radio frequency emitters deployed within the flow path or upon the exterior of the flow path. Noble gases (He, Ar, etc.) are used for the carrier gas for the magnetic accelerator of the present invention because they are chemically inert. Noble gases are diamagnetic and not attracted to magnetic fields. The carrier gas functions to maintain a dilute environment for the paramagnetic species within the magnetic field which is necessary to inhibit if not prevent the recombination of CH radicals to acetylene and to prevent addition of these reactive species any acetylene formed by such recombination. Acetylene is diamagnetic, and it is inert to the diamond fabrication processes of the present invention but not necessarily chemically inert to CH radicals. Thus, it is not possible to predict what effect products of hydrocarbon chain extension by CH within the accelerator may have upon the accelerator itself or upon the diamond fabrication processes of the present invention. Consequently, secondary provision of carrier gas is mandated. Reliance upon the short transit times within the accelerator as an alternative is not acceptable. Secondary carrier gas injection should be either tangential (circumferential swirl) or axial at an oblique input angle. Whatever injection method is used, it should produce as little drag as possible. Injection transverse to the flow path (radial) is unacceptable for this reason.

Design of the accelerator must take into account methods to reduce the complexity of the apparatus overall. Secondary carrier gas injection mandates a carrier gas manifold. The low temperature operation requirement of the magnetic accelerator of the present invention mandates that the carrier gas be helium which is as gas at 77° K. Argon melts at 83-84° K, and other noble gases melt at even higher temperatures. The apparatus comprises a plurality of electromagnetic segments which are hollow core inductors, and radio frequency emitting segments. The electromagnetic segments must be energized and de-energized individually in precise sequence. To minimize wiring for these segments, data over power is mandated. Devices such as programmable gate arrays can provide a discrete digital identifier for each segment such that a digital signal conveyed over the electric power feed is recognized by a specific segment's gate array for activating charging and discharging circuits for a specific segment under software control. Secondary radiolysis segments may be supplied from a single shielded RF conductor, and digital addressing may be used to energize and de-energize these segments having the control or addressing data modulated onto the RF carrier.

Operation of the accelerator at low temperatures is necessary for two reasons. Paramagnetism is inversely proportional to temperature—greatest at low temperatures. EPR spectrometers may also operate at such low temperatures. Other apparatus such as ion implanters and cyclotrons which accelerate charged species (ions) electrostatically may also use electromagnetic acceleration may operate at similar low temperatures. Second, the coil wire materials, silver or copper, cannot carry the large currents required in the small diameter wires necessary to provide the largest number of coil turns over the shortest possible coil lengths requisite of each accelerator segment. Accordingly, the magnetic accelerator of the present invention operates using liquid nitrogen as its refrigerant which provides cooling at about 77° K.

The following table shows the approximate accelerator segment length for room temperature (273° K) continuous electrical conductivity and for low temperature (77° K) pulse (≤1 sec) conductivity for currents required by the magnetic accelerator of the present invention (see N.I.S.T. monograph 177, "Properties of Copper and Copper Alloys at Cryogenic Temperatures").

| Number of Turns | Current (amperes) | Wire Diameter mm | Coil Length cm |
|---|---|---|---|
| (273° K. (1.68 × $10^{-8}$ ohms/meter) | | | |
| 1000 | 10 | 1.0 (18ga.) | 100 |
| 1000 | 25 | 1.6 (14ga.) | 160 |
| 1000 | 100 | 4.1 (6ga.) | 410 |
| 77° K. (~1.21 × $10^{-9}$ ohms/meter) | | | |
| 1000 | 10 | 0.1 (38ga.) | 10 |
| 1000 | 25 | 0.13 (36ga.) | 13 |
| 1000 | 100 | 0.25 (30ga.) | 25 |

An accelerator segment should operate for durations of only about 1 second at low temperatures. At room temperatures and continuous service, the small diameter wires needed to provide the large number of coil turns over a short length would melt or pulverize.

The low temperature operation requirement of the magnetic accelerator of the present invention mandates that the carrier gas be helium which is a gas at 77° K. Argon melts at 83-84° K, and other noble gases melt at even higher temperatures. It should be noted that other types of accelerators such as ion implanters, cyclotrons, and mass spectrometers may operate at similar low temperatures. Such accelerators may also use electrostatic fields because charged particles (ions) are accelerated by these instruments.

The most critical and fundamental part of the magnetic accelerator is the individual accelerator segment whose design and operational parameters govern the design and operation of all of its other components. Other types of inductors may be used for the accelerator segments such as toroidally wound or iron core, but the hollow core coil provides adequate service and is the simplest and most economical electromagnetic component for the magnetic accelerator of this invention. The majority field strength of toroidal and hollow core coils are localized within the coil interior.

An inductor is a non-linear electromagnetic species which stores applied electrical energy as a magnetic field, opposing changes in current. At time zero, no energy is stored magnetically and the inductor behaves as an open circuit resisting current flow and dropping voltage across its leads. Over time, the current rises to a maximum with complete voltage drop and with the current remaining at its maximum, the rise time of the inductor, wherein the maximum magnetic field strength is attained. For the accelerator segment, this is the period when maximum magnetic acceleration is provided to the paramagnetic CH molecules resident within it. At the point that current is no longer applied to the inductor, it is necessary to discharge the inductor to relax its magnetic field so that the next accelerator segment may take over the process of accelerating the paramagnetic C—H molecules. This necessitates draining the accelerator segment of current resistively. The non-linearity of inductor charge and drain impacts the circuit topology to be used for each accelerator segment. Optimization of accelerator segment circuitry depends upon the inductance of the coil (in Henry's), the absolute or DC resistance of the coil, the rise or charging time of the coil, and the decay or current drain time of the coil. Thus, two types of circuits may be required for each accelerator segment: charge and drain. Both circuits (for each accelerator segment) must be software controlled. The operation of these circuits for each accelerator segment must be optimized to provide the smoothest "hand-off" possible from accelerator segment to accelerator segment throughout the entire instrument in both circuitry and control software.

The force exerted upon a magnetically susceptible mass by an electromagnet is known as its "pull strength" which can be determined by the expression $F=(n \times i)^2 \times 4\pi \times 10^{-7} \times (a/2g^2)$. F is the force in Newtons; n is the number of turns of the induction coil; i is the current in amperes; $(4\pi \times 10^{-7})$ is the dimensionless magnetic constant; a is the cross-sectional area of the magnetic field $(\pi r^2)$; g is the magnet gap which is the radius, r, of the induction coil. The expression reduces to $F=(n \times i)^2 \times 19.7392 \times 10^{-7}$. Thus, the force in Newtons, F, is an artifact of the number of coil turns of the coil and the current applied to the coil.

A non-limiting example of a high performance accelerator is detailed as follows. The accelerator is comprised of 150 tubular PTFE accelerator segments one meter in length having a diameter of 2 cm comprising a single layer of wire wound about the tubular structure and 150 tubular segments 0.1 m in length and 2 cm diameter which provide carrier gas inlet and microwave energy to the flow of C—H molecules within an enclosure which is cube 6 feet on a side. The 300 segments comprise 150 coils with each coil comprising 5 accelerator segments and 5 combined gas inlet and microwave discharge segments having a coil height of 5 cm (2 inches) for a height of approximately 5 feet. Deployed are accelerator electrical power-data line, accelerator electrical power control modules, carrier gas manifold, and microwave power coaxial line. A liquid nitrogen Dewar within the enclosure contains the accelerator coils, the electrical power-data line, accelerator segment electrical control modules to maintain operating temperature at 77° K. Within the enclosure are temperature sensors, liquid nitrogen level sensors, pressure sensors, and line current sensors which provide data to a central control computer.

The enclosure has valved fittings for connection to a liquid nitrogen reservoir, electrical connection to an external power supply for accelerator power and control data, electrical connection to the microwave power amplifier, electrical connections to sensors within the enclosure, a solenoid type pressure relief valve under computer control for nitrogen pressure relief, emergency pressure relief valve for nitrogen gas over-pressure and vacuum.

Care must be taken when charging the accelerator with liquid nitrogen refrigerant to prevent mechanical shock upon the accelerator components due to rapid cooling and mechanical contraction which can fracture coil wire and semiconductor devices as well as crack PTFE. Differences in thermal expansion and contraction coefficients of contacting components within the accelerator may also lead to fractures and cracking if initial cooling is improperly done.

External to the accelerator enclosure is the microwave radiolysis reactor which is connected to the input of the accelerator. This input is cooled by liquid nitrogen and is connected to the microwave power line within the enclosure as well as the carrier gas manifold. C—H molecules derived by microwave radiolysis of acetylene are introduced into the accelerator at this input.

An exit segment is connected to the last accelerator segment within the enclosure. Several exit types may be used. The simplest is a static device connecting a deposition substrate to the accelerator as closely as possible. This limits control over locational delivery of the fluence of accelerated CH radicals to the deposition substrate, however.

Precise locational control over delivery of the fluence of accelerated CH radicals to the deposition substrate is preferred. The means for such control are mechanical using stepper motor positioning apparatus under software control and magnetic steering or magnetic lensing.

Mechanical positioning by moving a short linear exit segment by stepper motors under software control is possible. The positionable exit segment connection would be a low-temperature flexible conduit similar to those used as "dip tube" lines for filling liquid nitrogen Dewars from a liquid nitrogen reservoir.

An alternative method of precise locational delivery of the fluence of accelerated diamond forming C—H molecules is the use of computer controlled stepper motors to move the deposition substrate and is preferred over a positionable exit segment because far less mass must be moved and because seals between the exit segment and the main body of the magnetic accelerator become complex and cumbersome. Semiconductor fabrication equipment frequently employ this method making such equipment commercially available for either exit or substrate motional control.

A most preferred method of controlled locational delivery of the fluence of accelerated diamond forming C—H molecules to the deposition substrate is magnetic steering or magnetic lensing which is used in high energy particle physics applications such as accelerators for colliders as well as semiconductor processing equipment such as ion implantation devices. Magnetic steering can provide very precise locational delivery of a fluence of magnetically susceptible species.

A magnetic steering device (or lens) comprises two sets of magnet pairs deployed around the fluence of magnetically susceptible species with one magnet pair deployed in a horizontal plane and the other magnet pair deployed in a vertical plane. While a magnetic steering device can be fabricated as a single element, such steering devices are typically fabricated as two separate devices very closely deployed along the flow axis of the fluence of magnetically susceptible species.

The opposed magnet pair deployed vertically controls horizontal deflection, and the opposed magnetic pair deployed in the horizontal plane controls vertical deflection. The deflecting magnets of both opposed magnet pairs are ferromagnetic electromagnets providing high field strength external to their coils which fields extend into the vicinity of the fluence of magnetically susceptible species. See FIGS. 8, 9 and 10.

Deflection in both planes is controlled by differential energization of the magnet pairs. For magnetic steering of a fluence paramagnetic species, deflection is greatest towards the more powerful magnetic field of one member of the opposed pair. Under very precise computer control of energization of opposed electromagnet pairs in both planes, it is possible to "pattern" the delivery to the fluence of magnetically susceptible species to a deposition substrate or other ultimate target (see for example Brookhaven National Laboratory Publication BNL-81842-2009-CP "Steering Magnet Design for a Limited Space; Proceedings of the Particle Accelerator Conference 2009, Vancouver, CA MO6PFP005). Magnetic steering may be combined with mechanical positioning of the deposition substrate, also. The use of locational control by mechanical means, magnetic steering, or a combination of both enables additive manufacturing of diamond products by methods of the present invention.

The volume of acetylene delivered to the radiolysis reactor and thus to the accelerator is limited to that volume of acetylene which upon radiolysis delivers a volume of C—H molecules equal to that of one accelerator segment at the chosen dilution in carrier gas of 1% v/v in this example. In this example, accelerator segment dimensions of 100 cm length and 2 cm diameter provide a volume of 314.159 cm$^3$ which is ~1.83 mg of acetylene or C—H molecules. The radiolysis reactor must be controlled to provide its product with sufficient volumetric precision that the accelerator segments are not overwhelmed or "flooded" with excessive mass.

The total transit time of the accelerator is ~150 seconds because the current pulse delivered to each accelerator segment is ~1 second. Two modes of operation are possible. Continuous mode operation proceeds by full time radiolysis of acetylene in carrier gas to produce C—H molecules continuously delivered to the accelerator. Pulsed mode operation proceeds by admission of a 1 second duration radiolysis of acetylene in carrier gas to the accelerator every transit time period (150 seconds). In both modes, all accelerator segments are energized sequentially for 1 second to provide kinetic energy to the C—H molecules contained with an accelerator segment. However, in pulsed mode, one accelerator volume of C—H molecules transits through the accelerator and exits the accelerator before another volume of C—H molecules is admitted to the accelerator from the radiolysis reactor.

The difference between the two modes is throughput and applied force. Currents on the order of 1000 amperes may be used ONLY in pulsed mode because the current load and thermal consequences of such high current operation is both difficult and costly with respect to design and implementation of refrigerant and power supply equipment. Continuous mode may operate with lower currents on the order of 100 amperes or less. The difference between the two modes are total throughput and shock wave magnitude. In continuous mode, the total throughput of C—H molecules is 273.77 mg per 150 seconds, but in pulsed mode, the total throughput of C—H molecules is that of only 1 segment, ~1.83 mg per 150 seconds. In continuous mode, a throughput of about 5.98 g (~29.9 carat) per hour or 143.5 g (~717.6 carat) diamond forming carbon per day is possible. In pulsed mode, a throughput of ~39.97 mg (~0.1998 carat) or 0.959 g (4.795 carat) of diamond forming carbon is possible.

Continuous mode and pulsed mode operation of this exemplary accelerator provide different instantaneous shock wave pressure equivalents which is shown for three continuous mode operation current levels and one high current one pulsed mode operation. Force as determined from pull strength calculation is in Newtons for a single segment having 1000 turns over 100 cm and for operation of all 150 segments of the exemplary magnetic accelerator of the present invention.

| PULL STRENGTH IN NEWTONS | | |
|---|---|---|
| Amperes | Single Segment | 150 Segments |
| 10 | 197 | 29,550 |
| 25 | 1,234 | 185,100 |
| 100 | 19,739 | 1,960,850 |
| 1000 | 1,973,920 | 196,088,000 |

To determine the effective instantaneous pressure obtained by acceleration of the paramagnetic CH radicals, the pull strength alone provides only a force in Newtons (N), not Newtons/meter$^2$. One pound per square inch (psi) is ~6,894.8 Nm$^2$. The fluence of CH radicals exiting the accelerator has an area of $3.14159 \times 10^{-4}$ m$^2$. The effective instantaneous pressure is: (Newtons/$3.14159 \times 10^{-4}$ m$^2$)/6,894.8 psi/(N/m$^2$).

The figures below show the effective instantaneous pressure in pounds per square inch (PSI) obtained for accelerator current levels used for 1 and 150 segments.

| Amperes | 1 Segment N | 150 Segments N | 1 Segment psi | 150 Segments psi |
|---|---|---|---|---|
| 10 | 197 | 29,550 | 90 | 13,642 |
| 25 | 1,234 | 185,100 | 570 | 85,445 |
| 100 | 19,739 | 2,960,850 | 9,113 | 1,366,927 |
| 1000 | 1,973,920 | 296,088,000 | 911,294 | 13,669,406 |

Under computer control, it is possible to use as many or as few accelerator segments per cycle required for a specific shock wave effective pressure equivalent. At higher pressures, the choice for deposition substrate materials becomes a significant factor.

For Step 1 of the method of this invention, high currents which produce very high velocities resulting in large shock wave energy are not necessary being limited by the strain energy of the molecules comprising the monolayer of diamond forming tetrahedranoidal reactant previously described. It is Step 2 of the method of this invention which benefits from high current operation which may provide shock wave effective instantaneous pressures sufficient to move the domain of the CVD diamond forming process process away from the graphitic domain and into the diamond diamond favored by high pressures.

The step 1 process of the present invention has an extremely short duration and proceeds under mild conditions. This allows for the use of mechanical positioning apparatus: move target, move accelerator exit. The more rigorous conditions of the step 2 process, temperatures on the order of 500 to 600° C. and durations which can be on the order of hours or even longer, make magnetic steering the best choice.

Accelerator Track

As noted above, the accelerator track is a contiguous helical structure containing two types of inter-fitting segments, which segments are: an accelerator segment and a secondary RF-carrier gas inlet segment. These two types of segments alternate: accelerator→RF-carrier gas→accelerator→RF-carrier gas→etc. These segments are operatively connected, i.e., inter-fitted.

The accelerator track is preferably made of PTFE (polytetrafluoroethylene) although other inert plastics may be used. A variety of inter-fitting PTFE types are known, such as. for example, PTFE tubing with male-female connection points. Many of these types of connecting parts have recesses for O-rings to ensure tight vacuum and gas fits. However, gas tight fits can also be obtained without O-rings with some PTFE inter-connects. These types of connecting parts are well known to those or ordinary skill in chemistry and chemical engineering. PTFE is also known as teflon.

Preferably, the accelerator track or path is constructed from individual PTFE segments having male to female connection features and, more preferably, having O-ring sealing capability.

Assembling the Accelerator Track

Using the PTFE segments having male to female connection features and preferably having O-ring sealing capability, assembly of the accelerator track is preferably conducted as follows:

1) The coils are wound on the accelerator segments,
2) RF emitters are mounted within the RF-carrier gas segments, including the leads for carrying the RF power for connection to the control module for an individual segment.
3) The carrier gas inlet is mounted onto and through the segment wall for directing the carrier gas floe either as a swirl inlet or at an oblique or axial angle.
4) The individual control modules are then connected for the accelerator coils and secondary RF-carrier gas segments to their respective connection points, and leads extend from these control modules for connection to their respective power-data (RF) lines. The gas inlet fitting has connectors extending from them for connection to the carrier gas manifold.
5) Using a center tubular template which allows for access to the inner side of the accelerator path, and which has mount and securement points for the various components, the segments are assembled to each other and are then wound around the tubular template to produce the entire contiguous helical path or track.
The carrier gas manifold is also a contiguous helical structure also containing interfitting segments. This is installed inside the accelerator track or path and connections to the RF-carrier gas segments are also made.
6) Lastly, the power-data lines for accelerator power are RF-power are installed and which also have a helical structure, and the electrical connections are made to the respective control-power modules for each segment. Then, this entire assembled structure is inserted into the enclosure which has mount points for contact with the tubular (inner) template to secure it and the accelerator components connected to it within the enclosure (the Dewar).
7) It is noted here that testing is required to ensure that all segments are properly connected to each other and to their control-power modules as well as for electrical response and continuity. It is recommended that this testing be done at very low currents and low temperature conditions. Leak testing and vacuum testing is also conducted.

Diamond Fabricator Reactor

Deployed at the exit of the magnetic accelerator is the reactor within which diamond fabrication occurs. Two somewhat different fabrication processes are used in the method of the present invention. Both processes are driven by a shock wave produced by impact of a fluence of magnetically accelerated CH radicals upon a deposition substrate. In one, the first step process, a mono-layer of high purity diamond is produced by a chemical synthesis of diamond. In another, the second step process, a fluence of magnetically accelerated CH radicals directed onto the mono-layer of diamond obtained in the first process to produce diamond by carbon atom assembly. In this case, the mono-layer of diamond functions as a template for carbon atom assembly to form diamond which diamond growth continues to propagate due to continued provision of a fluence magnetically accelerated CH radicals. See FIG. 6.

The conditions of the two processes are quite different requiring different temperatures, different demands upon their specific deposition substrate supports, and different reaction conditions and times. It is possible to design a single reactor to accommodate both processes, and it is also possible to design to different reactors each specific to one step and both being readily connected to and operated with the magnetic accelerator of the present invention.

The first step reaction requires a deposition substrate support capable of reduced temperature operation. The simplest and most economical means to this end is to fabricate a support having channels for coolant recirculation. The mild conditions of this step allow for stepper motor-based positioning devices for locational control over provision of the fluence of magnetically accelerated CH radicals. Another requirement of the first step is manipulation of the supported mono-layer of diamond forming, thermally stable tetrahedranoidal molecule. This diamond forming reactant is produced outside of the diamond fabrication reactor and is transported to and placed within the reactor in a sealed container. Thus, provision must be made for positioning and unsealing this mono-layer container. A modification of a vacuum atmospheres dry box capable of high vacuum to allow connection to the magnetic accelerator is one way to meet these first step requirements, but this reactor would be unsuitable for use in the second step.

If practice of the method of this invention is limited to only the first step, a simpler single segment accelerator may replace the complex exemplary toroidal accelerator. In this case, a linear accelerator containing a single accelerator segment and no secondary gas injection-secondary RF emission segment may be used, and the modified dry box is the best choice for the diamond forming reactor.

The second step requires a deposition substrate support capable of high temperature operations such as an electric resistance block heater or an induction type block heater. Other means such as laser or infra-red heating may be used. A load-lock is all that is necessary for placing the supported diamond mono-layer (obtained from the first step) into the diamond forming reactor.

A single reactor may be designed to accommodate the requirements of both steps. The only real difference between the first step and second step reactors is the need to manipulate the diamond forming reactant container of the first step. This can be done by a remote manipulator arm and end effector within the reactor eliminating the need for glove box type appurtenances. Both reactors require connection to the accelerator, vacuum source, gas sources, spectroscopic monitoring instruments, optional effluent monitoring, observation window, temperature and pressure sensors, and a load-lock. The reactor may contain stepper motor positioning devices or only rely upon magnetic steering for locational control over the fluence of magnetically accelerated CH radicals. If a single reactor is used, it must also have provision for coolant recirculation through the deposition substrate support block.

The present invention provides a process for preparing diamond in situ and may be used as a research and development tool or for diamond production on a commercial scale. The present invention also provides an apparatus by which the process may be practiced.

Disclosed herein is both a full enabling description of the present invention as well as clear guidelines for one of ordinary skill in the art to practice the present invention in expanded scope.

In a first diamond forming process (step 1), the present method provides kinetically energized methylidyne or methanetriyl radicals to a supported or immobilized mono-layer of a thermally-stable tetrahedranoidal compound, i.e., thermally stable to ~300° C., and which cannot rearrange autogeneously. The diamond so obtained in this first process of the present method may be a diamond monolayer which may be used as a final product, a nanodiamond particle precursor, a precursor to formation of a graphite mono-layer, graphene, or may be used as a template for the assembly of carbon atoms to form diamond in a subsequent process (step 2) of the present method.

In a second diamond forming process, the present method provides kinetically energized methylidyne or methanetriyl radicals to a supported layer of diamond which may be obtained from the first diamond forming process of the method of this invention to form a diamond mass.

The present invention is premised, in part, upon the use accelerated methylidyne and methanetriyl radicals, both of which are paramagnetic due to the presence of at least one unshared electron: methylidyne having one unpaired electron and methanetriyl having three unpaired electrons. Both radicals are especially paramagnetic at low temperatures. The methylidyne radical is in a singlet (ground) state, whereas the methanetriyl radical is in an excited triplet state. Both radical species are magnetically susceptible and may be accelerated by the magnetic fields impressed upon them by the magnetic accelerator of the present invention to impact a diamond forming deposition substrate and transfer their kinetic energy to that surface generating a shock wave which results in an instantaneous effective pressure to drive the assembly of carbon atoms to form diamond in a domain favorable to diamond formation over graphite formation due to the existence of said instantaneous effective (shock wave) pressure.

Further, a mass of diamond may be built up from individual monolayers. More precisely, the diamond mass may be prepared using only the first step of the present method by dihydrobenzvalene monolayer formation followed by reaction of the dihydrobenzvalene monolayer with accelerated CH radicals successively.

Figure 5:
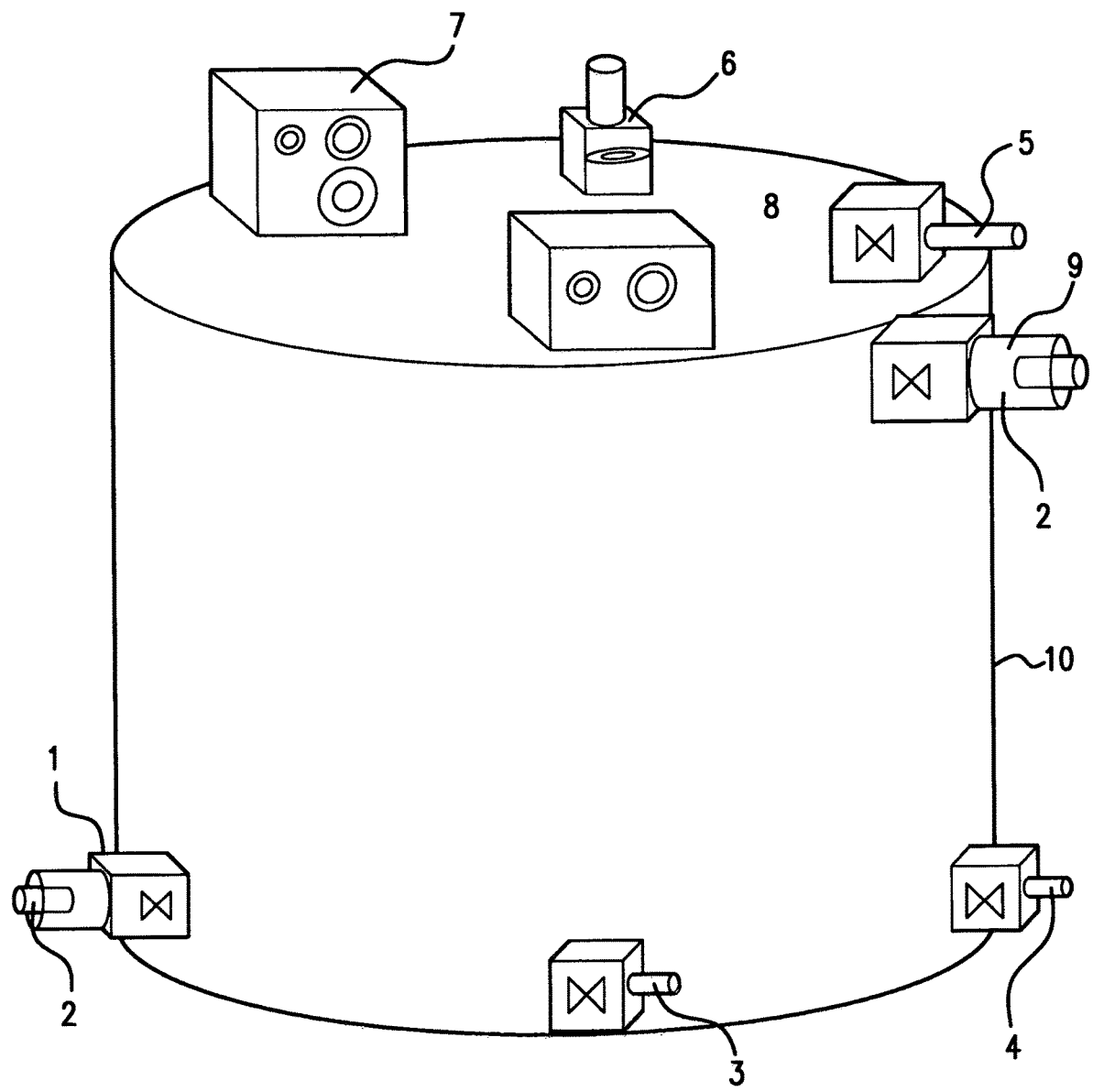
FIG. 5 illustrates a schematic of a toroidal magnetic accelerator apparatus.

Generally, the first step is conducted using a linear accelerator as depicted in FIG. 7. The second step is generally conducted using a toroidal accelerator as depicted in FIGS. 5 and 6.

Detailed Description of the First Step

The object of the present invention with respect to this first step process is to produce a very pure and contiguous diamond monolayer which may be a stand-alone product, a precursor to nanodiamond particles formation, a precursor for monolayer graphite (graphene) formation, or a seed or template for carbon atom assembly to form diamond in a second step of the present invention.

The first step of the method of this invention is a chemical synthesis of diamond. A chemical synthesis is described in U.S. Pat. No. 9,016,917. Briefly, a five (5) carbon atom tetrahedron, a diamond molecule, is formed in and precipitates from the vapor phase by insertion of a carbon atom, derived by microwave radiolysis of cubane at 12 Ghz and 1 Kw into the tetrahedranoidal molecule, benzvalene, with concomittant ejection of hydrogen atoms and a —HC═CH— species, Both of these diamond forming reactants are chemically unstable species, and it is their chemical instability which is exploited by U.S. Pat. No. 9,016,917.

The method of the present invention exploits the stability of its diamond forming reactants rather than their chemical chemical instability as in U.S. Pat. No. 9,061,917. In the present method, a thermally stable tetrahedraoidal molecule which cannot rearrange to another molecular structure is used. Several such thermally stable non-rearragning molecules are known, but dihydrobenzvalene preferred for the method of the present invention.

Dihydrobenzvalene is prepared as an added in-situ step from benzvalene. Benzvalene is obtained by reaction of lithium cyclopentadienide with dichloromethane which is separated by liquid chromatography from a mixture comprising benzvalene, benzene, and diethyl ether. For dihydrobenzvalene, the crude reaction mixture is distilled into a second reactor and is treated with 2-methoxyethanol, ethanolamine, and potassium ferricyanide to produce diimide in situ which is the active hydrogen source for saturation of the benzvalene olefin segment to provide dihydrobenzvalene. Dihydrobenzvalene is isolated from the reaction mixture in moderate yield and good purity by fractional distillation without the need for further purification by liquid chromatograpy. Dihydrobenzvalene is thermally stable to ~300° C., vaporized at 69-70° C., has a vapor pressure of ~117.8° C. at atmospheric pressure and 25° C. See, for example, Moriarity, R. M. Office of Naval Research Document AD-A235 202, May 16, 1991; M. Christi and G. Bruntrup, Chem. Ber., 107, 3908 (1974); Katz et al., JACS, 1971, 93 (15) pp 3782-3783.

In the diamond forming reaction of the present invention, dihydrobenzvalene is deployed upon a support and is impacted by an accelerated CH radical which impact transfers the kinetic energy of the accelerated CH radical into the tetrahedranoidal molecular structure of dihydrobenzvalene which is the driving force for the reaction to form diamond. This driving force kinetic energy transfer is a shock wave which propagates through the supported reactant molecule. Such a diamond forming reaction cannot occur in the vapor phase because reactant collision can only result in a carom of the two reactants away from each other.

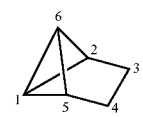

Dihydrobenzvalene
(Hydrogen atoms no shown)

While not meaning to be bound by theory, the most likely mechanism for the insertion of the methine carbon atom into the tetrahedranoidal molecular structure occurs at the cyclopentanoidal $C_2$—$C_3$—$C_4$—$C_5$ trapezoid causing distortion of the tetrahedranoidal molecular structure. It is the energy of the shock wave generated at impact of the accelerated CH radical with dihydrobenzvalene which determines the outcome of ensuing chemical reactions. Excessive kinetic energy (too large a shock wave) will result in so large a magnitude of distortion of the tetrahedranoidal molecular structure that uncontrolled or random bond breaking occurs driving decomposition of dihydrobenzvalene. Insufficient kinetic energy (too small a shock wave) results in insufficient distortion of the tetrahedranoidal molecular structure such that the methine carbon is ejected, and it is likely to react with another CH radical to form acetylene.

With a shock wave of sufficient energy to drive the forward reaction but insufficient to cause decomposition, the forward reaction proceeds. Initially, impact of the CH radical upon the dihydrobenzvalene molecular structure distorts its molecular structure by expansion of the bridgehead (bicyclobutanyl—$C_2$—$C_5$—$C_6$) bond angle which increases the (non-bonded) $C_2$—$C_5$ distance which. In turn, the $C_5$—$C_4$ and $C_2$—$C_3$ bonds lengthen and are weakened, and bonds begin to form the electron rich methine carbon atom to the $C_2$ and $C_2$ carbon atoms which will displace $C_3$ from $C_2$ and $C_4$ from $C_5$. Simultaneously, steric hindrance to shock wave driven ingress of the methine carbon into the bridgehead segment ($C_1$—$C_2$—$C_5$—$C_6$) decreases, and $C_1$-methine proximity increases enabling bond formation between methine and these bridgehead carbon atoms. As the concerted methine-to-bridgehead carbon atom bond formation proceeds, bonds to hydrogen atoms bound to the bridgehead carbon atoms lengthen. Ultimately, the ($C_3$—$C_4$)—$H_2C$—$CH_2$— segment and the methine and 4 bridgehead hydrogen atoms are ejected leaving the five carbon atom tetrahedron product. The forward reaction is driven by the increase in entropy and thermodynamic stability of the product as well as the shock wave itself as long as there is adequate but not excessive shock wave energy.

Bridgehead axis ($C_2$—$C_5$—$C_6$) bond angle expansion may relieve some angular strain but not the angular strain for cyclopropanyl segments ($C_1$—$C_5$—$C_6$, $C_1$—$C_2$—$C_6$). If the shock wave energy resulting from methine insertion into the tetrahedranoidal structure exceeds the strain energy, carbon-carbon bond breaking within the bridgehead section of the tetrahedranoidal molecule will occur faster than the concerted bond breaking and bond making between methine and bridgehead carbons can occur. In other words, the tetrahedranoidal molecular structure will collapse, and the molecule decomposes. Consequently, the kinetic energy of the shock wave must be limited. Strain energy data for cyclopropane and bicyclobutane have been reported as both ab initio calculations as well as experimentally derived results. The figures range from as low as 27.6 to as high as 63.9 kcal/mol. Of note, also, is the enthalpy of formation for the rearrangement of benzvalene to benzene which is 25.9 kcal/mol. Benzvalene could not undergo this synthetic transformation because it readily rearranges to benzene, and the benzvalene molecular structure cannot accommodate the larger diameter of the CH radical compared to that of atomic carbon (CH=207 pm, C=140 pm).

Dihydrobenzvalene Monolayer

The preferred method of diamond monolayer fabrication uses dihydrobenzvalene as a monolayer deployed upon a supported reaction substrate. This method is mandated for use with the diamond monolayer product:

1) as a seed or template for fabrication of a diamond by the assembly of carbon atoms using accelerated CH radicals as the carbon atom source, the second step of the present method;

2) as a precursor for the formation of a graphite monolayer, graphene;

3) fabrication of a diamond mass by successive build-up of diamond monolayers; and 4) as a final product containing both reaction substrate and diamond monolayer.

A supported layer of dihydrobenzvalene which is not a monolayer may be used as a diamond monolayer forming reactant with accelerated CH radicals because the monolayer of diamond which forms seals off the subtended layer of dihydrobenzvalene from further reaction with accelerated CH radicals. Dihydrobenzvalene is liquid at room temperature. As such, it may act as a lubricant for removing the diamond monolayer from the reaction substrate if an isolated diamond monolayer product is required. The layer of dihydrobenzvalene which is not a monolayer may also be used where the diamond product is nanodiamond particles. In either case, dihydrobenzvalene adhering to the diamond monolayer must be removed by evaporation or solvent wash using a solvent such as dichloromethane, and great care must be used in manipulations of the mechanically fragile diamond monolayer.

For either method of providing dihydrobenzvalene to the supported diamond forming reaction substrate, low temperature manipulation of the dihydrobenzvalene layer is necessary to prevent mass loss due to the vapor pressure of dihydrobenzvalene, and this is crucial if a monolayer of dihydrobenzvalene is used. See Example 1 further below regarding the preparation of a monolayer of dihydrobenzvalene.

Deposition of a monolayer of dihydrobenzvalene can be performed using standard Langmuir-Blodgett trough techniques well known for the formation and study of monolayers of a wide variety of compounds Apparatus for such monolayer formation is commercially available. (see Brazilian Journal of Physks, vol. 22, no. 2, June, 1992 for a review).

Alternatively, it is possible to prepare a monolayer of dihydrobenzvalene using standard chemical synthesis laboratory (organic, inorganic, organometallic) methods and apparatus as described herein by a non-limiting example.

The "footprint" of the dihydrobenzvalene molecule must be determined. This relies upon an optimum planar molecular packing model, "length×width." Accordingly, the longest axial and widest transverse dimensions are used which can be determined from reported C—C and C—H bond lengths, dihedral angles (H—C—H, C—C—C) for benzvalene and structurally related molecular structural segments. To each of the width and length determinations must be added two Van der Waals radii. Hydrogen atoms are the most peripheral species portending from the carbon atom framework of the dihydrobenzvalene molecule. From this calculation can be determined the solid state "packing" area of the dihydrobenzvalene molecule from which the number of molecules to form the dihydrobenzvalene monolayer completely covering a given substrate area leading to the required mole fraction and, in turn, the mass of dihydrobenzvalene required. See R. D. Suenram and M. D. Harmon JACS 1972 94 5915.

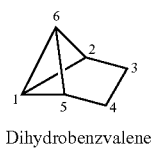

Dihydrobenzvalene (Hydrogen atoms not shown)

Transverse Dimension (Width)

Width is determined from $C_2$—$C_5$ distance of the $C_2$—$C_3$—$C_4$—$C_5$ cyclopentanoidal trapezoidal segment of dihydrobenzvalene, the $C_2$—H and $C_5$—H bond lengths, and two hydrogen atom radii. Width: 413.16 pm plus 220 pm (Van derWaals radius×2)=633.16 pm.

Axial Dimension (Length)

Length is determined from the $C_1$ to $C_3$—$C_4$ mid-line axis, the $C_1$—H bond length plus one covalent hydrogen radius, the $C_3$—H bond length, and one hydrogen covalent radius. Both cyclopentane (envelope conformer) and cyclohexane (chair conformation) relieve ring strain by bending out of plane at about 110.9° which is used to determine the $C_1$ to $C_3$—$C_4$ mid-line axis. Length: 411.997 pm plus 220 pm (Van der Waals radius×2)=631.997 pm.

The dihydrobenzvalene molecular footprint is determined to be 400,788.38 pm$^2$. It should be noted that the product of the first step diamond forming reaction, a five carbon atom tetrahedral molecule, has a "footprint" of 374,278.9 pm2, about 93.4% the area of dihydrobenzvalene, and this shrinkage should be taken into consideration in the fabrication of the diamond mono-layer.

Diamond Monolayer Fabrication

The diamond mono-layer as well as its precursor dihydrobenzvalene mono-layer is mechanically fragile as is any mono-layer. Regardless of the end use intended for the diamond mono-layer, the best practice is to use a diamond (and dihdyrobenzvalene) contacting material as the support which has the closest coefficent of expansion to that of diamond which is 1.1-1.3, That material is Invar, a nickel alloy, having a thermal expansion coefficient of 1.4. Mismatch of thermal coefficients of between diamond and the diamond contacting substrate can result in fracture of the mono-layer. High temperature and high thermal stress conditions mandate the use of Invar. See https://www.engineeringtoolbox.com/linear-expansion-coefficients-d 95.html).

Reaction conditions and parameters must also be optimized for the first step diamond fabrication process of the present invention. The reactor may contain an inert gas atmosphere, or it may be under vacuum. Vacuum produces no drag upon the fluence of accelerated CH radicals, but requires rigorous attention to the low temperature mandated for the mono-layer of dihydrobenzvalene to prevent mass loss due to its vapor pressure. Recirculating deposition substrate refrigerant temperature should be maintained at or below −45° C. with −78° C. preferred for vacuum operation. If inert atmosphere is used, it should be as an expanding inert gas delivered from a pressure tank via a dip tube into the reactor.

The provision of the fluence of accelerated CH radicals is done using the minimum kinetic energy required to effect insertion of the CH radical into the dihydrobenzvalene molecular structure and drive the forward, diamond forming, reaction which should not exceed the strain energies of the bridgehead (bicycobutanyl and cyclopropanyl) segment of the tetrahedranoidal molecular structure of dihydrobenzvalene, and these reported energies range from 27.6 to 69.5 kcal/mol, In terms of effective instantaneous pressures provided by impact generated shock wave, the range is from ~17 to ~39 psi which is well within the capability of a single segment of the exemplary magnetic accelerator of the present invention operating at ~6 to ~8.7 amperes.

Excessive CH radical reactant mass is not necessary for the diamond mono-layer production of the present invention. The mass of a single segment of the exemplary magnetic accelerator of the present invention, ~1.83 mg, is about 450 times that of the mass of the supported dihydrobenzvalene mono-layer, ~4.1 μg. Thus, pulsed mode operation is sufficient to provide the required mass of CH radical reactant. In this case, magnetic lensing is the best choice for delivery of the fluence of accelerated CH radical reactants. The circular exit profile of the magnetic accelerator of the present invention is 3.14159 cm$^2$, and the profile of a typical 5 inch semiconductor fabrication deposition substrate disk is 122.718 cm$^2$. Conical expansion of the exit profile to match the deposition substrate profile is ~39:1. By this method, delivery of reactant is uniform over the entire reaction surface reducing the opportunity for localized heating of the diamond forming surface which could lead to non-contiguous product formation.

If conical expansion of the exit profile is not used, then provision of the fluence of accelerated CH radicals onto the deposition substrate requires multiple passes of directed profiles by magnetic steering or by stepper motor-controlled movement of the substrate or the exit segment. To ensure complete coverage, ~80 passes are required with an optimal steering strategy. Whatever the intended use of the diamond mono-layer product, it must be brought to ambient temperature slowly to avoid fracture due to thermal expansion. This can be done within the reactor by successive changes of support block refrigerants or by rapid transfer to an external chamber having temperature control.

Optimization of diamond mono-layer fabrication of the method of the present invention is best accomplished using real time spectroscopic monitoring. FTIR reflectance spectroscopy can provide adequate information about reactants and products. This method can also provide data regarding contiguity of the diamond mono-layer product as well as that of the supported dihydrobenzvalene mono-layer. Other instrumental methods can be used, but FTIR reflectance is the most economical method.

The diamond monolayer produced by the first step process of the present invention may be used as a final product or as a precursor for graphite mono-layer (graphene) formation. Another use for the diamond layer is to provide nano-particulate diamond.

Graphene

Graphite is the naturally occurring and most common allotrope of carbon. The graphite crystal structure is hexagonal and is best described as "chicken wire". Graphene is the mono-layer of graphite. Graphene has the highest tensile strength known, is a zero band-gap semi-conductor, thermal conductivity greater than that of diamond, and room temperature electrical conductivity greater than copper or silver.

The diamond-to graphite transformation is favored by low pressure and temperatures on the order of 1500° C.-2500° C. See, for example, Evans and James, Royal Society of London Series A, Vol. 277 #1369 pp. 260-269, Jan. 1, 1964; M. Seal *Nature* volume 185, pages 522-523 (1960). See FIG. 2.

The mono-layer of diamond produced by the first step of the present invention can be transformed to graphite to provide the mono-layer of graphite, graphene.

A monolayer of diamond produced by the first step of the present invention can be transformed to graphite to provide the monolayer of graphite, graphene. The Invar supported diamond monolayer is subjected to high vacuum once it reaches ambient temperature, and evacuation of the reactor within which the diamond monolayer is deployed is done slowly to avoid disruption of the diamond monolayer from its support which can lead to fracture of the mechanically fragile monolayer. Once high vacuum is reached, the temperature is raised slowly to between 1,500° C. and 2,500° C. to avoid fracture of the diamond monolayer by thermally-induced shock. The investigations reported for the diamond-to-graphite transformation indicated complete transformation of diamond to graphite in times ranging from a few minutes to several hours. The transformation is best monitored spectroscopically. Once graphitization is complete, the supported layer of graphene should be brought to ambient temperature slowly to avoid thermal shock fracture. Once ambient temperature is reached, the reactor is slowly flooded with air. Subsequent removal of the graphite monolayer, graphene, from the reactor should be done with care. Despite its high tensile strength, graphene is also reported to be somewhat brittle See, for example, "Fracture Toughness of Graphene", Zhang, et al., *Nature Communications, Apr.* 29, 2014.

Nanodiamond Formation

The mono-layer of diamond produced by the first step of the present invention can be a convenient source of nanodiamond particles having controlled shape and dimension. The mono-layer of diamond is the ultimate nano-diamond sheet in that it is one atom thick. The carbon atoms of diamond are bonded by very strong covalent bonds, and this accounts for its hardness. However, the same bonding provides diamond almost no plastic deformation ability, and diamond cannot absorb impact shock which accounts for its brittleness. The method of the present invention exploits this property of diamond to produce nano-particulate diamond from the mono-layer "nano-sheet" diamond.

The tool required for fracturing the diamond mono-layer into controlled shapes and sizes is a nano-textured metal die such as the stainless steel nano-textured die of Yongseon et al., ACS Biomaterials Science & Engineering, 2018, 4, pages 90-97 having dimensions on a scale smaller than that of a bacterium. Impact of such a die upon the brittle diamond mono-layer of the present invention can shatter it into particulates whose shapes and dimensions are an artifact of the die surface.

It is not necessary to use a monolayer of dihydrobenzvalene for reaction with accelerated CH radicals to produce a diamond monolayer. Dihydrobenzvalene may be a coating on the deposition substrate which is not a mono-layer because it is not used in a second process and will not undergo thermal stress leading to its fracture. A monolayer of diamond will form upon reaction with the fluence of accelerated CH radicals, but the first layer which forms seals off any subtended dihyrobenzvalene from further reaction. The same precautions, conditions, and procedures used for the formation of a diamond mono-layer previously described are necessary, but the layer of dihdrobenzvalene reactant need not be a mono-layer. The subtended and unreacted dihydrobenzvalene provides a degree of lubrication for separation of the diamond mono-layer so formed if it is desired to remove the diamond mono-layer, but care must be exercised in so doing due to the mechanical fragility and brittleness of the diamond mono-layer. It should be noted that the use of a non-monolayer coating of dihydrobenzvalene upon the deposition substrate is not appropriate for other uses of the product diamond mono-layer unless techniques and equipment for safely removing and handling are available.

The formed diamond monolayer has x width, y length and z height or thickness. Thus, along the z-axis, the diamond formed is nanodiamond or, actually, picodiamond. Removal of the diamond monolayer from the adhered and unreacted dihydrobenzvalene underneath is easily accomplished by merely sliding the formed diamond monolayer off of the liquid dihydrobenzvalene underneath as dihydrobenzvalene is a liquid at room temperature, thereby collecting the monolayer diamond.

In the alternative, the formed diamond monolayer may be left on the support with the unreacted dihydrobenzvalene underneath, and then placed in a press to pulverize the diamond monolayer. Unreacted dihydrobenzvalene is removed by solvent wash or by evaporation prior to or after pulverization.

Detailed Description of the Second Step

It is an object of the second step of the present invention to identify and correct the flaws of conventional CVD diamond fabrication.

Conventional CVD diamond processes use a hydrocarbon as the carbon source gas which is exposed to a source of high energy at the input of the CVD diamond fabrication reactor to cleave hydrogen from carbon. Most commonly, microwave discharges (~0.2.45 GHz; 1-6 Kw) are used. Other means used include lasers, hot filament, and short-wave UV. The hydrocarbon source gas is typically a blend of source gas and hydrogen carrier gas because hydrogen is used to remove non-diamond carbon impurities formed upon the heated deposition substrate by hydrogenolysis to volatilize hydrocarbon(s) so formed away from the diamond forming surface. Hydrogen gas may also be introduced vicinal the deposition substrate for this purpose separately or combined carrier gas use. The product of the high energy exposure propagates toward and onto a heated deposition substrate (~800° C.), and it is the thermal energy of the deposition substrate which drives the process of carbon atom assembly to produce diamond. Propagation of the product(s) of hydrocarbon decomposition toward and onto the deposition substrate is by diffusion, and this occurs under conditions of reduced pressure typical of conventional CVD diamond fabrication processes, ≤200 mm Hg.

While not meaning to be bound by theory, the following flaws in conventional CVD diamond fabrication processes are identified, and means to remediate these flaws are proposed by the method of the present invention.

Carbon Source Gas Decomposition

Cleavage of carbon-hydrogen bonds in methane by exposure to various high energy sources does not produce atomic carbon exclusively or as the major component of the decomposition product mixture. For methane, the majority product is the methyl radical, .CH3, along with smaller amounts of the methylene diradical, :CH$_2$, the methylidyne radical CH, and very small amounts of atomic carbon, and other hydrocarbon sources such as ethane, ethylene, acetylene, and small ring cyclic hydrocarbons perform no better. This requires that the energy of the deposition substrate be used to complete the task of carbon-hydrogen bond cleavage to afford atomic carbon. It is not possible to predict the behavior or fate of such radical species contacting the heated deposition substrate. It is also difficult to assess the behavior of atomic carbon formed in the presence of hydrogen gas intended to remediate the formation of non-diamond carbon impurities such as graphite. More simply, there are too many species and too many possibilities for their behavior with too little means to exercise control over said species or their fates under the conditions of conventional CVD diamond processes.

Low Pressure Operation

Figure 2:
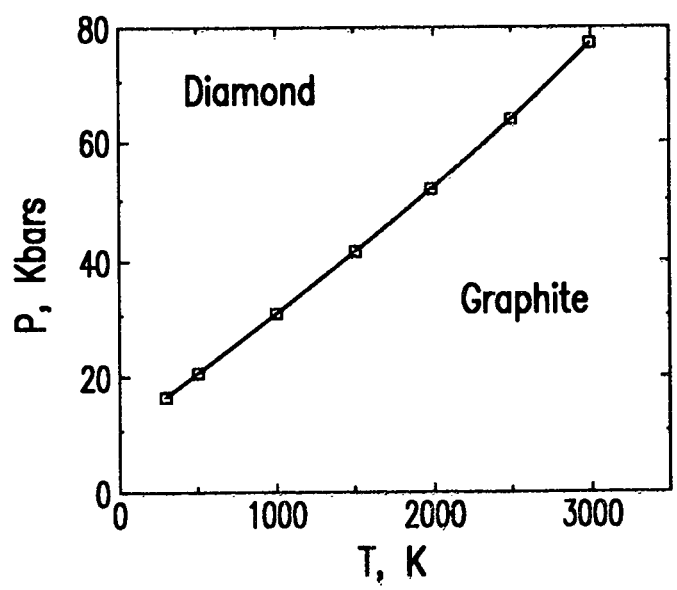
FIG. 2 illustrates that lower temperatures and pressures favor graphite production over diamond.

Graphite versus diamond domains are shown in FIG. 2.

The operational conditions of CVD diamond fabrication processes at reduced pressures (≤200 mm Hg) and temperatures around ~800° C. place them in the graphitic domain. Thermodynamically: (where ΔG is the entropy of formation) $\Delta G_{diamond}$=2.8 Kj/mol; $\Delta G_{graphite}$=0 Kj/mol (ground state form of carbon). The enthalphy of formation of graphite from diamond is given by the expression:

$$\Delta G_{transformation} = \Delta G_{product} - \Delta G_{reactant} \text{ or } 0\text{-}2.8 \text{ kj/mol} = -2.8 \text{ Kj/mol}.$$

From this, the equilibrium constant of the transformation, K, is determined by the expression K=e^−($\Delta G_{transformation}$/RT) or K=e$^{-1.13}$ making the equilibrium K=3.096 thus favoring the product, graphite, over the reactant, diamond. The physics alone make it remarkable that diamond forms at all in conventional CVD process.

Propagation of the Carbon Source Materials

CVD diamond fabrication processes are plagued by the low regional homogeneity of the diamond product produced as the quality of the diamond as well as layer thickness decrease the perimetrically. Minimal control can be exercised over the pattern of diffusion under the low pressure conditions within the reactor, and considerable development in source delivery configurations have been reported. Practitioners of CVD diamond fabrication report that diamond is deposited upon reactor walls as well as on the deposition substrate requiring mechanical remediation of the reactor interior between each fabrication cycle.

Template or Seed for Carbon Atom Assembly to Diamond

It is most likely the use of seed diamond to induce growth of diamond over graphite which is responsible for the formation of diamond under conditions which appear to favor graphite formation overwhelmingly. The diamond seed deployed upon the deposition substrate of a typical CVD reactor are particulates or powders. The result is that the seed or template is not contiguous and provides voids or regions wherein there is no template to "guide" the atomic motion of the carbon atoms to assemble to form diamond. In a domain which favors graphite over diamond, the absence of such assembly template is likely to favor graphite formation. Because the graphite-diamond equilibrium overwhelmingly favors graphite, the rate of formation of graphite must be significantly greater than that of diamond. Further, the diamond seed itself is not necessarily free of graphite or other non-diamond carbon impurities which, if located at the surface, must induce non-diamond product formation, as well. Infrared absorptions attributed to non-stoichiometric hydrocarbenoidal species which are lattice stabilized or "trapped" may also be a consequence of the non-contiguous nature of the diamond seed (voids). Hydrocarbenoidal species ($C_nH_y$, y<4) present in void areas may be contained within or "overgrown" by graphite or even diamond which forms in these regions. Fully formed atomic carbon located within these regions may also be isolated from additional carbon atoms by graphite formation and may not assemble to any ordered structure which could account for the presence of amorphous carbon impurities within the CVD diamond product.

To the credit of the CVD diamond fabrication process, it is most likely that the presence of seed diamond particulates drive the process to form diamond in the face of conditions which are unfavorable for carbon atom assembly to form diamond. This suggests that only moderate changes to existing CVD diamond fabrication processes are necessary to improve the quality of the diamond product produced significantly—the goal of the present invention.

Improvements to the CVD Diamond Fabrication Process

The present invention addresses the problems associated with the use of hydrocarbons such as methane as the carbon source gas by the use of the CH radical which is obtained from acetylene by a high energy discharge such as microwave radiolysis at frequencies and power similar to those already in use for methane. Thermolytic cleavage of the single hydrogen atom bound to carbon requires less substrate energy than is needed for thermolysis of methane-derived carbon atom sources. The use of CH reduces the complexity of side reactions at the deposition substrate because there is only one substance, and its thermolysis product is atomic carbon, and only atomic carbon. Additional energy for carbon-hydrogen bond cleavage to provide atomic carbon is also an artifact of the shock wave produced upon impact of the accelerated CH radical upon the deposition substrate. Similarly, hydrogen carrier gas use is avoided.

Figure 8:
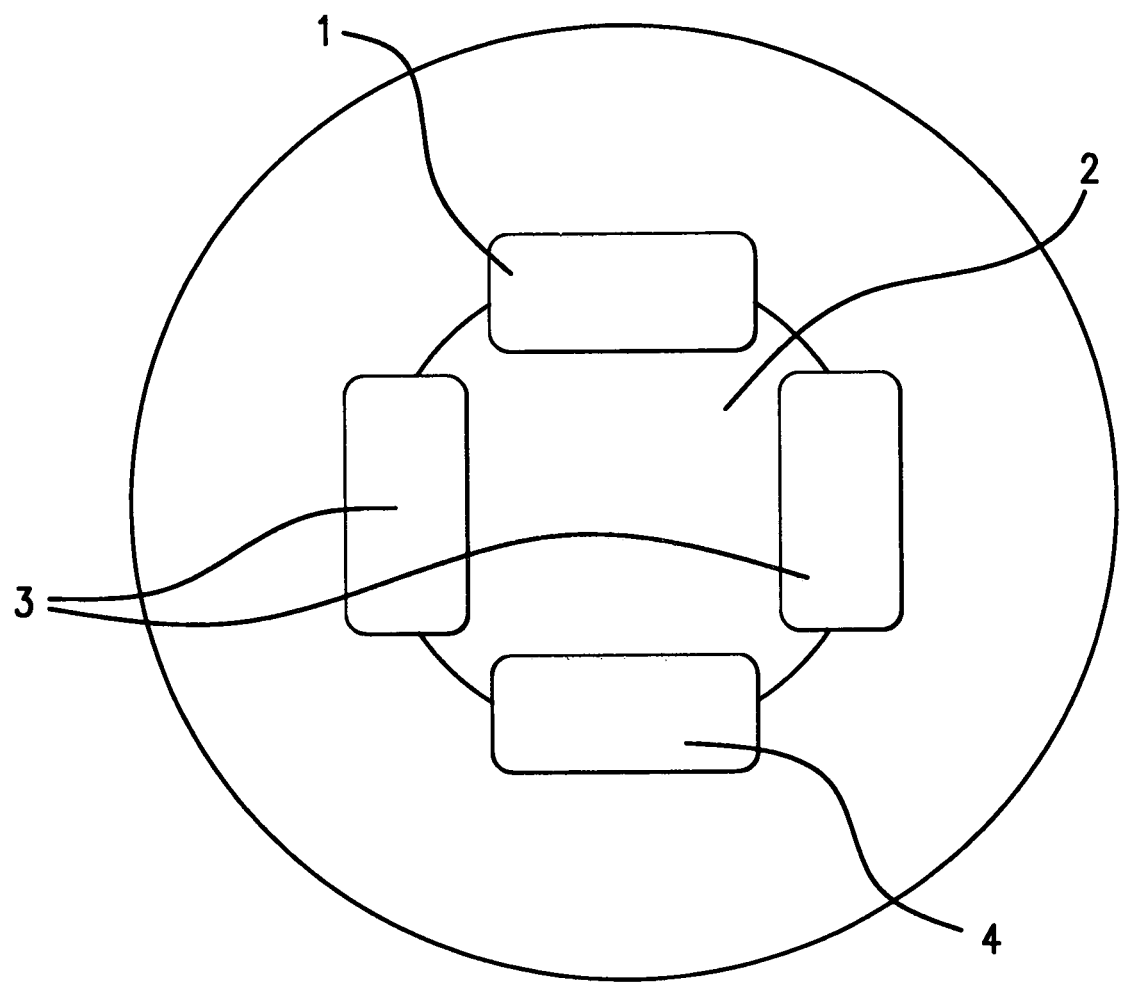
FIG. 8 illustrates a schematic for magnetic steering-lensing with vertical deflection electromagnets 1 (up) and 2 (down) and horizontal electromagnets (3), both left and right as appear in the figure.
Figure 9:
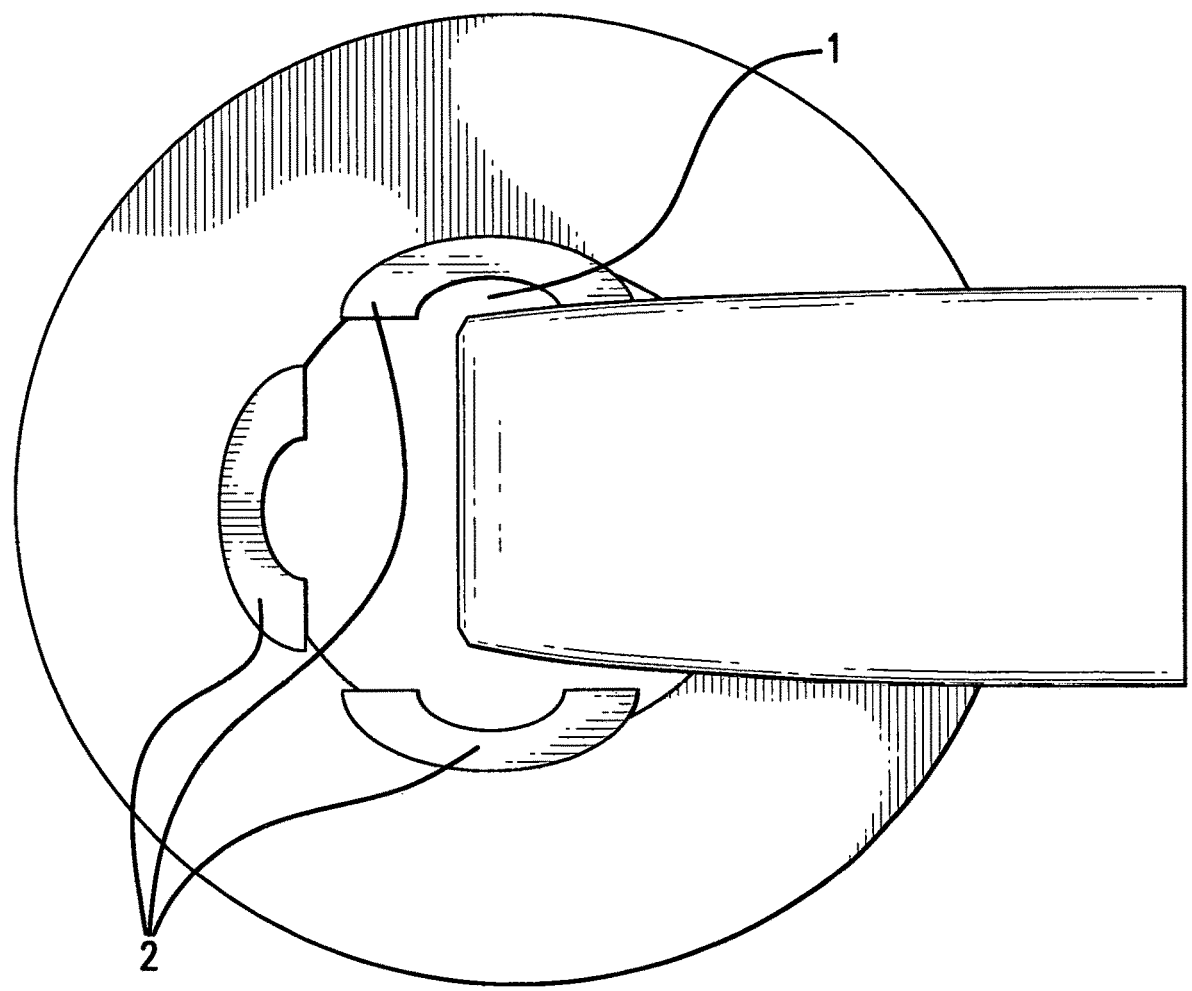
FIG. 9 illustrates a schematic for magnetic steering-horizontal deflection right.
Figure 10:
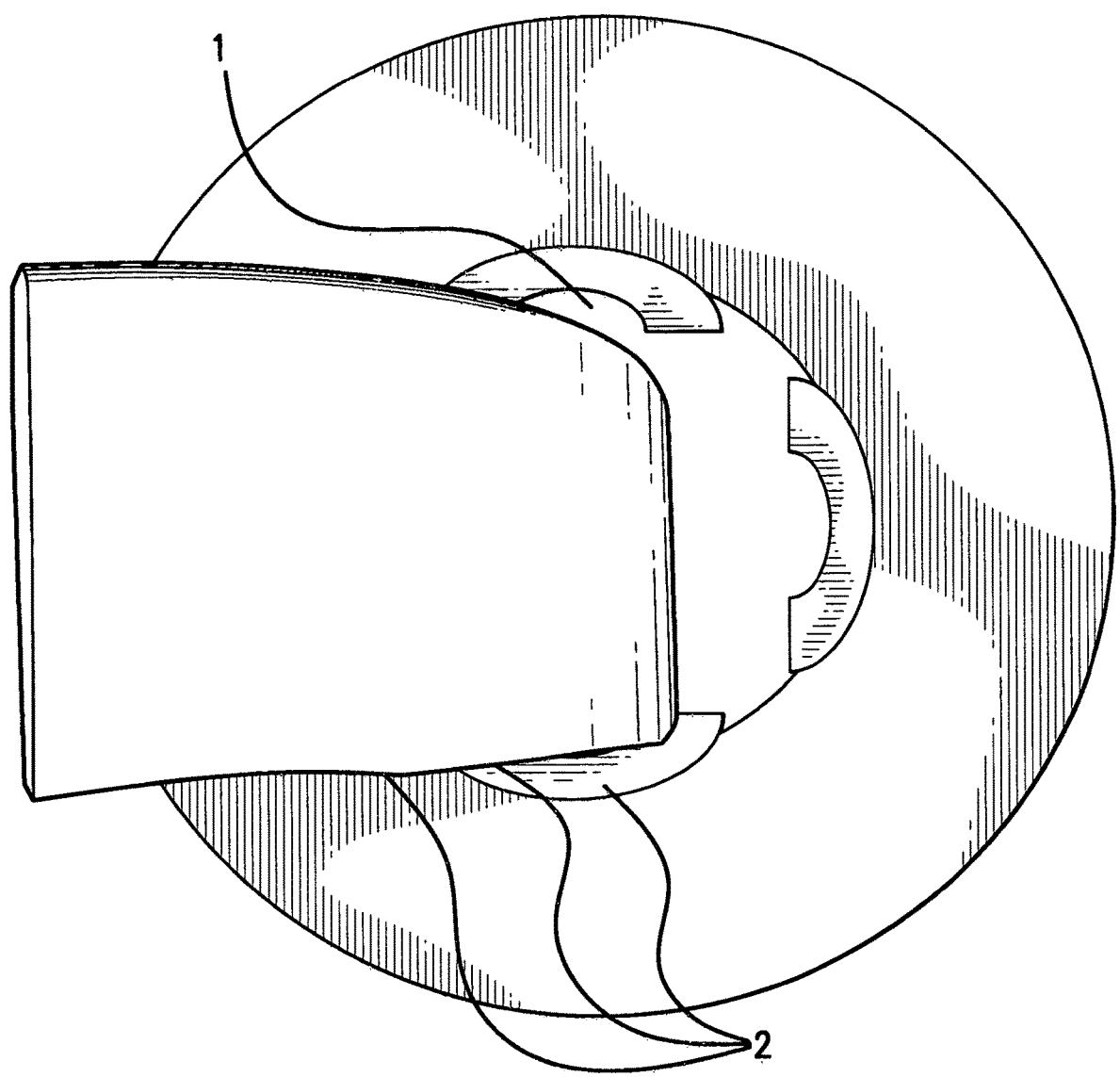
FIG. 10 illustrates a schematic for magnetic steering-horizontal deflection left.

Substrate regional homogeneity inconsistencies can be eliminated because diffusion is not the means by which the carbon source materials propagate onto the diamond forming deposition substrate. The magnetically accelerated paramagnetic CH radicals are delivered to the deposition substrate at a uniform and controlled high velocity as a fluence or beam which can be steered magnetically to provide complete regional control over diamond formation. Mechanical positioning means may also be used to control the location of the fluence of CH radicals delivered to the diamond forming surface. Electromagnet orientations for effecting magnetic steering are depicted in FIGS. 8, 9 and 10.

Opportunistic formation of non-diamond carbon impurities such as graphite which arise from the non-contiguous nature of conventional CVD diamond seeds deployed upon the deposition substrate (voids) may be eliminated because the template for diamond formation is the homogeneous, ultra-pure diamond layer produced by the first step of the present invention using a shock wave enhanced chemical synthesis of diamond. Considering the effectiveness of the less optimum diamond forming template or seed of conventional CVD diamond, the use of a pure and contiguous diamond layer for the same purpose provides an effective means for eliminating non-diamond carbon from the diamond product of the present invention.

The present invention uses a magnetic accelerator to provide kinetic energy (acceleration) to the paramagnetic carbon atom source, the CH radical. Upon impact with the deposition substrate, the transfer of this kinetic energy to the surface produces a shock wave, and this shock wave provides an instantaneous effective pressure to the diamond forming surface. It is this pressure which can transfer the operational domain of the carbon atom assembly process away from and into a domain which favors diamond formation over graphite—pressure. The use of an evacuated reaction chamber is preferred because there is no significant vaporous mass to provide contact drag to the fluence of accelerated (high velocity) paramagnetic CH radicals. The ambient pressure within the diamond forming reactor under these conditions is effectively zero, but the pressure of the reaction is high. Thousands of pounds per square inch can be produced as the effective instantaneous pressure resulting from the impact shock wave of the accelerated CH upon the diamond forming substrate.

The rate of diamond product formation can be significantly higher than that of conventional CVD diamond fabrication processes by the method of the present invention, and that rate can be controlled using factors of CH mass concentration, mode of accelerator operation, current levels provided to the accelerator segments, and the number of accelerator segments actuated per accelerator cycle.

The shock wave diamond fabrication method of the present invention has other benefits. The fluence of accelerated CH radicals can be directed with sufficient precision to allow for additive manufacture of diamond products. There is no restriction to the ambient pressure within the diamond forming reactor. That is, ambient pressure operation is possible using an inert gas atmosphere within the reactor. Alternatively, the process can be conducted in vacuum. Operation within a vacuum provides far less drag to the fluence of accelerated CH radicals, however. Control over product throughput is also possible based upon operational modes of the magnetic accelerator, and the overall rate of diamond production can be much greater than either CVD or HPHT processes.

In practice of the second step of the method of the present invention, the diamond mono-layer produced by the first step of the method of this invention functions as the high purity and contiguous seed or template for carbon atom assembly to form diamond. No external source of non-diamond impurity such as graphite is ever introduced into the diamond forming process because the first step process cannot produce graphite or any other non-diamond carbon impurity.

The carbon atom source is the accelerated CH radical, and the driving force for diamond formation is the shock wave produced by the impact of these accelerated CH radicals upon the deposition substrate, Initially, it is the first process template which controls carbon atom assembly to diamond along with the instantaneous pressure resulting from accelerated CH impact to produce the shock wave which, along with the pure and contiguous diamond template, overwhelmingly favors diamond formation over graphite formation and the formation of non-diamond carbon species. Other than the hydrogen ejected by carbon-hydrogen bond cleavage, no substantial amount of hydrogen exists to interfere with the process. The first step diamond forming mono-layer essentially disappears being overgrown by more diamond because the conditions of the second step process of the present invention overwhelmingly favors diamond formation.

At the end of the fabrication cycle, it is necessary to remediate the surface of the diamond product due to denial of source material which leads to non-stoichiometric non-diamond species at the surface, and only at the surface. Accordingly, the same technique that is used in conventional CVD diamond fabrication is used for this surface remediation which removes non-diamond carbon impurities by hydrogenolysis. This is the only instance wherein hydrogen is admitted into the diamond forming reactor—surface remediation. There is no need for hydrogen, otherwise. Accordingly, hydrogenolysis proceeds on the diamond product surface to remove any non-diamond carbon impurities. This can be controlled by spectroscopic observation of the process to determine at what point to cease remediation by hydrogenolysis. Alternatively, surface remediation can be done mechanically (surface abrasion).

Briefly, the diamond-monolayer of the first step is placed in the reactor, and the reactor is evacuated followed by admission of an inert gas such as argon or helium if the process is to be conducted with an ambient inert atmosphere despite drag considerations. Gradual substrate heating is initiated to bring the diamond mono-layer to thermolysis temperature to avoid corruption of the diamond monolayer due to thermal shock from deposition substrate and diamond thermal expansion coefficient differences, and both the acetylene radiolysis reactor and the magnetic accelerator are brought on line by the computer control system along with spectroscopic monitoring and effluent monitoring instruments, if used. Once thermolysis temperature is attained, the fluence of accelerated CH radicals are provided to the diamond forming deposition substrate to produce a diamond mass until it is determined that cessation of the diamond forming process is appropriate. Thereupon, the CH radical generating radiolysis reactor and the magnetic accelerator are taken off line.

If surface remediation is to be effected mechanically, the substrate heater is de-energized to allow the supported diamond product to come to ambient temperature, and an inert gas is admitted to the reactor. If surface remediation is to be effected by hydrogenolysis, hydrogen gas is admitted into the reactor, and surface hydrogenolysis is followed spectroscopically until it is determined that the process is complete. Thereupon, substrate heating is discontinued, and the supported diamond product is allowed to come to ambient temperature in an inert atmosphere. Thereupon, the reactor is opened to retrieve the diamond product.

To further illustrate the present invention, the following examples are provided. These examples are not intended to be limitative, but only exemplary.

Example 1

Preparation of a Monlolayer of Difiydrobenzvalene

A standard five (5) inch disk as is used in semiconductor manufacture is selected for deposition of a monolayer of dihydrobenzvalene. The disk comprises silicon carbide covered by an Invar layer about 5 mm thick. The area of the disk is 122.718 cm$^2$ or 1.22718×10$^{22}$ pm$^2$ requiring 3.0619151× 10$^{16}$ molecules of dihydrobenzvalene, 5.08442956×10$^{-8}$ mol (MW=80.13)=4.0742 micrograms.

The disk is fitted with a fluid-tight, chemically resistant silicone polymer cylindrical collar and is placed in a vessel, such as a resin reaction kettle, of sufficient size to accommodate the disk, which is fitted with a septum port and a joint fitted with an eduction tube deployed centrally within the vessel and extending to within a 1-3 centimeters from the deposition disk. The vessel containing the disk is attached to a double manifold (Schlenck) line, evacuated and purged with an inert gas, such as argon or nitrogen with argon being preferred as it is denser than air and provides a manipulative advantage. The vessel is cooled to about −45° C.

A laboratory micro-balance having a gas tight door and fitted with ports for gas flow through is used. A stoppered flask containing the stock supply of dihydrobenzvalene and a tared septum capped vial placed within the balance compartment, and cooled inert gas such as nitrogen, argon, or $CO_2$ flowing from a gas cylinder having a liquid withdrawal eduction tube is passed through the balance compartment to provide a reduced temperature environment for sample manipulation. Thereupon, 4.0742 mg of dihydrobenzvalene is weighed out into the tared septum cap vial. Using an accurate volumetric syringe, 100 ml of a solvent such as methylene chloride is introduced into by the vial. After sufficient agitation to ensure complete dissolution, a 10 microliter aliquot is of the dissolved dihydrobenzvalene is drawn from this stock solution using a microliter syringe. The aliquot of dihydrobenzvalene is then transferred onto the disk within the vessel through a septum port with repeated washings of the syringe with additional solvent are performed to ensure complete transfer of dihydrobenzvalene onto the disk.

The vessel is placed in a cold bath at not greater than −45° C. and brought to bath temperature. The small volume of dissolved dihydrobenzvalene is localized at the point of deposition from the syringe at this point. Dimethyl ether (b.p.=−24° C.) is led into the vessel to condense upon the disk and further dissolve the dihydrobenzvalene. Cold bath temperature should not rise above about −30° C., and the height of solvent should not exceed 2-3 cm. The dilute mixture of dihydrobenzvalene, dimethyl ether, and trace transfer solvent is allowed to stand for about 1 hour to ensure complete dissolution and homogeneity.

Removal of solvent to leave behind a uniform monolayer of dihydrobenzvalene is performed at a reduced temperature not exceeding the boiling point of dimethyl ether. Solvent removal must be performed slowly and carefully to avoid bumping which can be best effected using a needle valve to retard the rate of dimethyl ether gas evolution. The last traces of solvent are removed under reduced pressure at no more than −78° C. The vessel containing the supported mono-layer of dihydrobenzvalene is flooded with inert gas, sealed, and removed, from the Schlenck line, and transferred to an inert atmospheres dry box or a glove box filled with inert gas. Whichever transfer receiver is used, it should contain the holder for the deposition disk containing the monolayer, and this holder should have an easily removed and applied closure for transfer into the diamond forming reactor. Transfer of the disk into the holder should be quickly, and transfer of the sealed holder into the diamond fabrication reactor should also be done quickly.

Example 2

First Step Diamond Mono-Layer Fabrication Process

The first operation of this first step of the present invention is to bring the magnetic accelerator and the control system online and to provide liquid nitrogen to the magnetic accelerator such that the rate of cooling will not provide cold-shock to any of its internal components. Once the magnetic accelerator has reached 77° K and is stable at this temperature, the diamond forming reactor is evacuated and filled with an inert gas obtained from a gas cylinder having a dip tube for extraction of the gas a liquid from the cylinder. The gas evolved from the cylinder provides a cold and inert atmosphere for transfer manipulation of the supported dihydrobenvalene mono-layer. At the same time, the refrigerated support block upon which the supported dihydrobenzvalene mono-layer is to be affixed is cooled by refrigerant recirculation to ~−45° C. Thereupon, the supported mono-layer is transferred into the reactor, removed from its vessel, and affixed to the refrigerated support block where it is maintained until it is deemed appropriate to cool it slowly to −78° C. Upon reaching this temperature, the reactor is evacuated, spectroscopic monitoring apparatus are brought on line, and the radiolysis reactor is brought online. Effluent pumps, traps, and valves are brought on line at this time. At this point, it is safe to evacuate the reactor if it is to be operated under vacuum, otherwise, cooled inert gas is continued to be provided to the diamond forming reactor.

Diamond mono-layer fabrication begins, and a fluence of accelerated CH radicals is provided to the supported dihydrobenzvalene monolayer at a level of acceleration resulting in a shock wave generated by impact of the kinetically energized CH radical fluence providing an instantaneous pressure insufficient to cause decomposition of the dihdyrobenzvalene but sufficient to effect irreversible insertion of the CH radical to drive the diamond forming reaction.

The small mass of reactants required to fabricate the mono-layer of diamond requires less than one minute for completion of the fabrication of the diamond mono-layer, but spectroscopic monitoring should be used to determine completion of diamond mono-layer formation. Alternatively, previously determined parameters for accelerator current levels, fabrication times, and optimized locational delivery patterning stored in control system memory may be used Upon complete diamond mono-layer formation by program or by spectroscopic monitoring, delivery of magnetically accelerated CH radicals to the deposition is ceased as is generation of CH radicals in the radiolysis reactor. Supply of refrigerant is ceased, and successively higher temperature refrigerants are provided to the support block for slow warming of the supported diamond mono-layer to ambient temperature to prevent thermal expansion fracture of the mechanically fragile diamond mono-layer. Warming of the mono-layer may be done using cooled inert gas atmospheres with controlled temperature increases to bring the mono-layer to ambient temperatures may also be used.

Once the diamond mono-layer has reached ambient temperatures the reactor is filled with nitrogen gas or air if the reaction was conducted under vacuum. Once ambient temperatures and pressures are attained within the reactor, the reactor is unsealed for retrieval of the diamond product.

It should be noted that the area of the diamond mono-layer will be smaller than that of the dihydrobenzvalene mono-layer because the "footprint" of the product, the five carbon atom diamond tetrahedron has a smaller "footprint" than that of the dihydrobenzvalene molecule, about 93.38%. Consequently, the area of the diamond mono-layer product will be about 114.60 cm$^2$ compared to that of the 5 inch disk, 122.718 cm$^2$.

Example 3

Second Step Diamond Mono-Layer Fabrication Process

The first operation of this second step of the present invention is to bring the magnetic accelerator and the control system online and to provide liquid nitrogen to the magnetic accelerator such that the rate of cooling will not provide cold-shock to any of its internal components. While the magnetic accelerator temperature is stabilizing, the control system is brought on line. The supported diamond mono-layer of the first step is placed in the reactor and affixed to the support and the reactor is sealed. The reactor is then evacuated, and is filled with inert gas such as argon. The supported diamond mono-layer is heated slowly to an operational temperature of no more than 600° C. to ensure that fracture of the diamond mono-layer does not occur due to mechanical stress due thermal expansion mismatch of the diamond contacting support material, for which, Invar is most preferred.

Once the magnetic accelerator has reached 77° K and is stable at this temperature, and the diamond mono-layer has been stabilized at its operating temperature, the radiolysis reactor is brought on line and programmed for accelerator operational mode (pulsed or continuous). If diamond fabrication is to be conducted under vacuum, the reactor is evacuated. Then, spectroscopic monitoring apparatus are brought on line, effluent pumps, traps, and valves are brought on line.

Magnetic accelerator power levels for producing CH radical acceleration sufficient to generate the desired shock wave effective instantaneous pressure are provided to the accelerator segments, and operational mode, pulsed or continuous is selected.

Provision of the CH radicals from the radiolysis reactor begins and the provision of the fluence of magnetically accelerated CH radicals to the deposition substrate with pre-programmed control over locational delivery of the fluence of magnetically accelerated CH radicals to the deposition substrate by magnetic steering or by stepper motor positioning apparatus begins.

At such time as it has been determined that a sufficient mass of diamond has been produced by operator observation or by previously determined time or mass parameters stored in memory of the control system, provision of magnetically accelerated CH radicals to the deposition substrate ceases, and radiolysis reactor operation ceases. Effluent handling also ceases. If surface remediation by hydrogenolysis is used, the reactor is evacuated and then filled with, hydrogen gas, and heating of the deposition substrate continues until surface remediation is determined to be complete.

Heating of the deposition is discontinued, and the diamond mass so produced is cooled to ambient temperature slowly. Upon complete cooling, the reactor is unsealed for retrieval of the product. Remediation of the product surface by mechanical means may then be performed if hydrogenolysis was not used for surface remediation.

Other Reactions with CH Radicals

As noted above, the combination of the acetylene reactor and magnetic accelerator of the present invention may be used to provide a fluence of CH radicals for use of other chemical reactions.

For example, CH radicals may be reacted with acetone to produce dimethylketene and acrolein. In fact, CH radicals may be conveniently reacted with an acetyl group to promote addition of a CH moiety to the acetyl group. See *Phys. Chem. Chem. Phys.* (PCCP) 2013 Mar. 21; 15(11):4049-4058.

DETAILED DESCRIPTION OF THE DRAWINGS

FIG. 1 illustrates the relationship between magnetic susceptibility and temperature for paramagnetic, ferromagnetic and antiferromagnetic species. Note the rapid increase in magnetic susceptibility for paramagnetic radicals with decreasing temperature.

FIG. 2 illustrates that the diamond-to-graphite transformation is favored by low pressure and temperatures on the order of 1,500 to 2,500° C.

Figure 3:
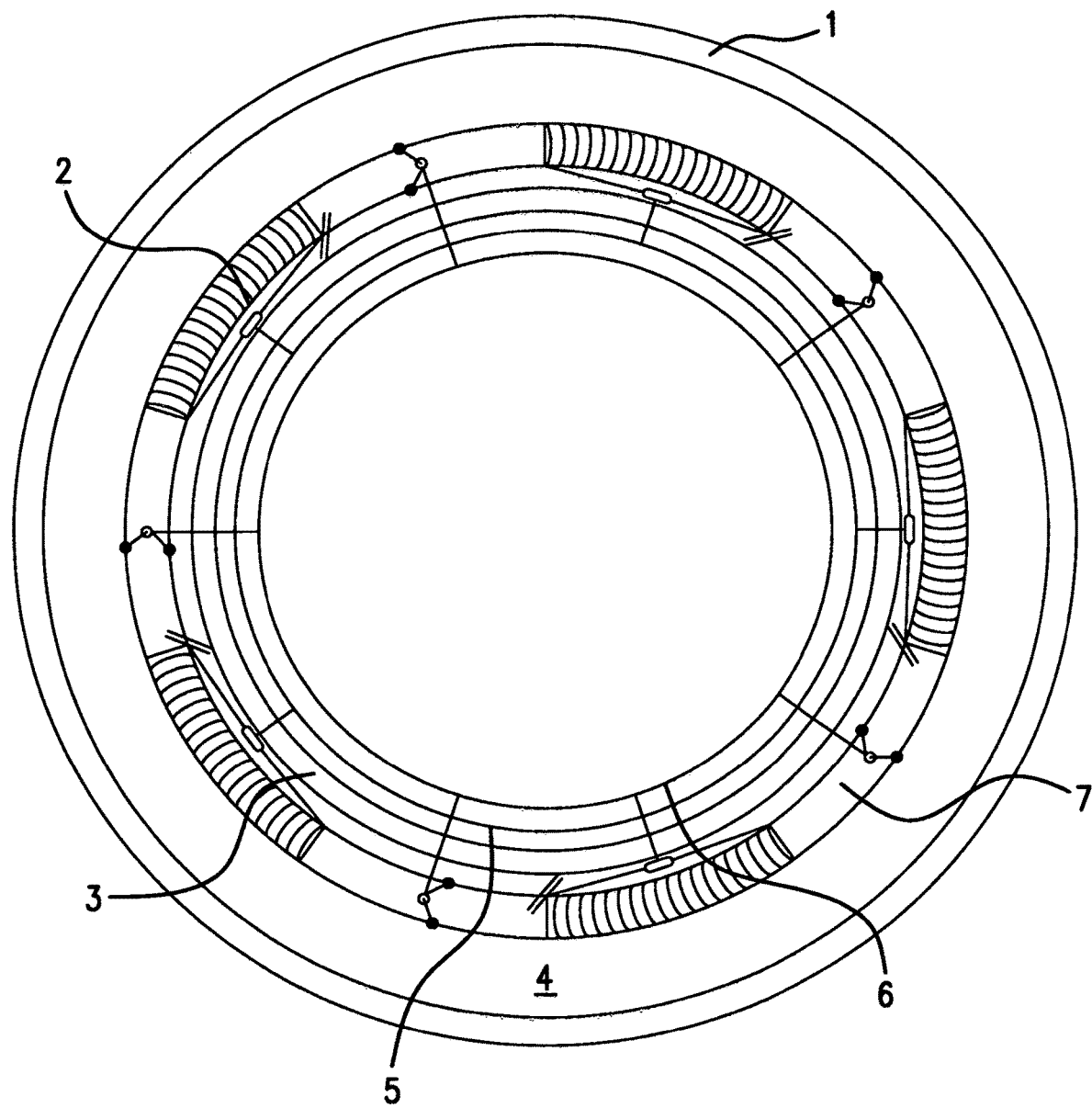
FIG. 3 illustrates a top view of an accelerator coil.

FIG. 3 illustrates a top view of an accelerator coil. The following numbered components are noted: Enclosure (1), Accelerator Track (2), Carrier Gas Manifold (3), Refrigerant Liquid Nitrogen (4), Accelerator Segments Power-Data Lines (5), Secondary RF Segments Power-Data Lines (6) and Secondary RF and Carrier Gas Inlet Segment (7).

FIG. 4 illustrates a top view of au input Accelerator Segment. The following numbered components are noted: Enclosure (1), Accelerator Track (2), Carrier Gas Manifold (3), Helium and Acetylene Input (4) from Reservoirs into Acetylene Radiolysis Reactor (5), Accelerator Segments Power-Data Lines (6), Secondary RF Power-Data Lines (7), and CH Radical Fluence exiting the Acetylene Radiolysis Reactor into the Accelerator (8).

FIG. 5 illustrates a Toroidal Magnetic Accelerator. The following numbered components are noted: CH Radical Input from Acetylene Radiolysis Reactor (1), Refrigerant Jacket (2), Helium Gas Input (3), Liquid Nitrogen Input Port (4), Vacuum Port (5), $N_2$ Over-Pressure Blow-Off Valve (6), Accelerator Segments Power-Data Interface showing DC Power Ground and From Control CPU (7) and RF Power Data Coaxial, From Control CPU and DC Power Ground (8), Exit Segment to Reactor (9) and Enclosure (10).

FIG. 6 illustrates a Diamond Fabrication Reactor-Step Two: High Acceleration CH Radical Fluence. The following numbered components are noted: Toroidal Accelerator Exit Segment (1), Liquid Nitrogen Jacket (2), High Vacuum Seal (3), Spectroscopic Monitoring Window (4), Steering Magnets (5), Pt Resistance Wire Temperature Sensor (to Control CPU) (6), Diamond Monolayer (7) on Invar Support (8), Heated Support Block (9), Inert Gas Port (10), Hydrogen Gas Surface Remediation Port (11), Vacuum-Effluent Port (12) and Load Lock (13).

FIG. 7 illustrates a Linear Accelerator for Step One. The following numbered components are noted: Helium Gas Reservoir (1), Acetylene Gas Reservoir (2), Valve (3), Acetylene Radiolysis Reactor (4), CH Radical Fluence Input Conduit (5) to Magnetic Accelerator (12), Liquid Nitrogen Refrigerant (6), Radiolysis and Accelerator Power Supplies (7), Accelerator Master Control (8), Steering Magnets (9), Accelerated CH Fluence Lensed Conically (10) and Dihydrobenzvalene Monolayer (11).

FIG. 8 illustrates Magnetic Steering-Lensing. The following numbered components are noted: Vertical Deflection Electromagnet (1), Accelerated CH Fluence (2), Horizontal Deflection Magnets (3) and Vertical Deflection Electromagnet (4).

FIG. 9 illustrates Magnetic Steering-Horizontal Deflection Right. The following numbered components are noted. Accelerated CH Radical Fluence Exiting Magnetic Accelerator (1), and Steering Magnets (2).

FIG. 10 illustrates Magnetic Steering-Horizontal Deflection Left. The following numbered components are noted: Accelerated CH Radical Fluence Exiting Magnetic Accelerator (1), and Steering Magnets (2).

FIG. 11 illustrates a section of helical tubing within a magnetic accelerator for containing CH Radical Fluence on accelerated approach to a target. The following numbered components are noted: Helical Coil for Containing CH Radical Fluence (1), and Liquid $N_2$ Refrigerant Jacket.

Other changes and modifications may be made to the above-described embodiments without departing from the spirit and scope of the present invention.

What is claimed is:

1. A method of producing a diamond monolayer, which comprises impacting a target comprising a supported or immobilized later of dihydrobenzvalene with a fluence of accelerated CH radicals, producing upon impact a shock wave having a force not exceeding the strain energy of said dihydrobenzvalene, to form, thereby said diamond monolayer.

2. The method of claim 1, wherein said fluence of accelerated CH radicals is produced by passing said CH radicals through a magnetic accelerator.

3. The method of claim 2, wherein said magnetic accelerator comprises electromagnets.

4. The method of claim 1, wherein said CH radicals are produced by dissociation of acetylene.

5. The method of claim 4, wherein said dissociation of acetylene is effected by microwave discharge.

6. The method of claim 4, wherein said dissociation of acetylene is under inert gas.

7. The method of claim 6, wherein said inert gas is helium.

8. The method of claim 4, wherein said dissociation of acetylene is effected by microwave radiolysis.

9. The method of claim 1, which further comprises converting the formed diamond monolayer to graphene, by subjecting the formed diamond monolayer to at least 1500° C. under high vacuum, to effect a diamond-to-graphite transition.

10. The method of claim 1, which further comprises isolating said formed diamond monolayer.

11. The method of claim 10, which further comprises fracturing said isolated diamond monolayer into nanodiamond particles.

12. The method of claim 11, wherein the diamond monolayer is fractured on a nano-textured metal dye.

13. The method of claim 1, which further comprises subjecting said formed diamond monolayer to a press to fracture said diamond monolayer to form nanodiamond.

* * * * *